United States Patent
Uozumi et al.

(10) Patent No.: US 7,162,389 B2
(45) Date of Patent: Jan. 9, 2007

(54) EVALUATION DEVICE FOR CONTROL UNIT, SIMULATOR, AND EVALUATION SYSTEM

(75) Inventors: Harunaga Uozumi, Kobe (JP); Kenichi Kinoshita, Kobe (JP)

(73) Assignee: Fujitsu-Ten Limited (JP)

(*) Notice: Subject to any disclaimer, the term of this patent is extended or adjusted under 35 U.S.C. 154(b) by 6 days.

(21) Appl. No.: 11/000,820

(22) Filed: Nov. 30, 2004

(65) Prior Publication Data
US 2005/0120320 A1 Jun. 2, 2005

(30) Foreign Application Priority Data
Dec. 1, 2003 (JP) ............ 2003-401828
Dec. 3, 2003 (JP) ............ 2003-404209

(51) Int. Cl.
G06F 11/30 (2006.01)

(52) U.S. Cl. ............ 702/182; 702/120; 703/19

(58) Field of Classification Search ............ 702/58, 702/108, 117–120, 123, 182–185; 703/13–16; 324/500
See application file for complete search history.

(56) References Cited

U.S. PATENT DOCUMENTS

| | | | |
|---|---|---|---|
| 3,702,011 A * | 10/1972 | Armstrong | 714/33 |
| 5,675,523 A | 10/1997 | Noda | |
| 2001/0052766 A1* | 12/2001 | Drescher et al. | 324/158.1 |
| 2002/0107678 A1* | 8/2002 | Wu et al. | 703/14 |
| 2002/0138245 A1* | 9/2002 | Yasuda | 703/19 |
| 2003/0093255 A1* | 5/2003 | Freyensee et al. | 703/13 |
| 2004/0031003 A1 | 2/2004 | Higuchi et al. | |
| 2004/0083234 A1 | 4/2004 | Higuchi | |
| 2004/0186938 A1 | 9/2004 | Imada et al. | |
| 2005/0022166 A1* | 1/2005 | Wolff et al. | 717/124 |

FOREIGN PATENT DOCUMENTS

| | | |
|---|---|---|
| EP | 585769 A1 * | 3/1994 |
| JP | 6-58995 | 3/1994 |
| JP | 7-325129 | 12/1995 |
| JP | 11-326135 | 11/1999 |
| JP | 2003-167756 | 3/2003 |
| JP | 2003-191946 | 7/2003 |

(Continued)

OTHER PUBLICATIONS

"Control Unit Simulation on the Serial Channel", May 1991, IBM Technical Disclosure Bulletin, vol. 33, Issue 33, pp. 170-172.*
U.S. Appl. No. 10/884,636, filed Jul. 2, 2004.

*Primary Examiner*—Marc S. Hoff
*Assistant Examiner*—Manuel L Barbee
(74) *Attorney, Agent, or Firm*—Fogg and Associates LLC; David N. Fogg

(57) ABSTRACT

An evaluation device, for evaluating a control unit (ECU) to which another control unit (ECU) is connected through a communication line and communicating with it, which can simulate even an unstable state such as when the other control unit does not start up right after power is turned on. The evaluation device is provided with a communication behavior simulating unit for simulating communication behavior of that other control unit and a switching unit for switching the communication behavior simulating means so as not to simulate the communication behavior. The communication behavior simulating unit is provided with an acknowledgement signal generating unit, and the switching unit disables the operation of the acknowledgement signal generating unit.

14 Claims, 18 Drawing Sheets

FOREIGN PATENT DOCUMENTS

| | | |
|---|---|---|
| JP | 2004-234530 | 8/2003 |
| JP | 2003-280902 | 10/2003 |
| JP | 2004-13626 | 1/2004 |
| WO | WO 03/046725 | 11/2002 |

* cited by examiner

EVALUATION DEVICE FOR CONTROL UNIT, SIMULATOR, AND EVALUATION SYSTEM

This application claims priority to Japanese Patent Application No. JP-2003-401828 filed on Dec. 1, 2003 and Japanese Patent Application No. JP-2003-404209 filed on Dec. 3, 2003.

BACKGROUND OF THE INVENTION

1. Field of the Invention

The present invention relates to an evaluation device for a control unit such as an electronic control unit (hereinafter referred to as an "ECU") of a vehicle, in particular an evaluation device provided with a common communication line with a plurality of control units and evaluating control units communicating with each other.

2. Description of the Related Art

Automobiles carry engine control ECU's for electronic control of their engines. An engine control ECU is sent signals indicating the engine speed, vehicle speed, etc. as detected by sensors provided on the chassis. The engine control ECU performs predetermined processing based on the received signals, sends the results of processing (for example, the fuel injection amount, ignition timing, etc.) converted to electrical signals to actuators and other control mechanisms provided in the vehicle, and controls the amount of injection of fuel, controls the ignition timing, controls knocking, controls the idling speed, etc. in a comprehensive fashion.

The signals input to an engine control ECU and the signals output from an engine control ECU change instant to instant. Further, these signals include signals which change according to each other such as signals indicating the engine speed, vehicle speed, etc. and control signals. Therefore, when confirming the operation of an engine control ECU or evaluating performance, it is necessary to mount the engine control ECU on an actual vehicle or use a simulator simulating the behavior of a vehicle.

Realization of such a simulator requires a program simulating vehicle behavior. Such a program is constructed based on the dimensions of the vehicle (for example, displacement, tire size, etc.) and includes as input elements the state in which the vehicle is placed, for example, the air temperature and atmospheric pressure, the vehicle weight, the road gradient, etc. and the current input states, for example, the degree of depression of the accelerator pedal, the degree of braking, and other human operational input, output of the ECU given to the vehicle, and other current input states. In a vehicle model, it is necessary to change the output of the program expressing vehicle behavior instant to instant in accordance with the changes in these input elements. A program simulating and reproducing such vehicle behavior is called a "vehicle model" (for example, see Japanese Unexamined Patent Publication (Kokai) No. 11-326135).

FIG. 6 shows an example of an evaluation device for an engine control ECU of the related art using a vehicle model. The vehicle model 40 is constructed based on dimensions of the set model such as the displacement and tire size. It receives the ignition signal or fuel injection amounts from the ECU 1 or the throttle opening degree etc. input from an input means 31 through an interface 32. Based on these inputs, the device simulates the states of the different parts of the vehicle such as the engine speed and vehicle speed and transmits the results of processing through the interface 33 to the ECU 1.

The vehicle model 40 is comprised of an air processor 41 for processing the intake pressure, intake air flow, etc., a torque processor 42 for processing the torque or knock, an A/F processor 43 for processing the air-fuel ratio, a speed processor 44 for processing the engine speed or vehicle speed, etc. The functions of the parts are realized by a software program.

On the other hand, recent vehicles carry a plurality of ECU's. As shown in FIG. 7, the plurality of ECU's, for example, an engine control ECU 1, a body ECU 2, an automatic transmission (AT) control ECU 3, an airbag ECU 4, etc. are connected via a bus 5 and construct a local area network (hereinafter referred to as a "vehicle-mounted LAN"). These ECU's can communicate data with each other. There are various communication standards for vehicle-mounted LAN's. The leading ones are the IEEE 1394, CAN, Lin, X-by-Wire, etc.

Each of the plurality of ECU's performs control based on the values of sensors or the operating state of the equipment in the vehicle. For example, the engine control ECU 1, as explained above, controls the fuel injection amounts etc., while the body ECU 2 controls the lamps, doors, etc.

Each ECU mounted in the vehicle controls the object assigned to it alone, but sometimes requires the transfer of data with other ECU's. The ECU's can utilize the vehicle-mounted LAN for the transfer of data with other ECU's and thereby cooperatively control the system. For example, if the engine control ECU 1 receives an airbag failure signal from the airbag ECU 4, the engine control ECU 1 can enter a failsafe mode where it limits the speed to under a certain constant speed or perform other operations.

When developing one such ECU alone in a state with no actual vehicle on hand, it is necessary to connect this ECU to an evaluation device provided with a simulator able to produce the communication signals generated by other ECU's for evaluation and study. For example, when CAN is adopted as the communication standard of the vehicle-mounted LAN, the evaluation device has to function to transfer signals according to the CAN standard. Further, sometimes it is required that an acknowledgement signal indicating that the signal has been received be sent to that device in the method of communication. In such a case, when testing an ECU, it is necessary that the evaluation device send such an acknowledgement signal.

FIG. 8 shows an ECU evaluation device of the related art provided with a signal transfer function based on this communication standard. This is comprised of a simulator 10 and a personal computer (hereinafter referred to as a "PC") 50 connected to this simulator 10. The PC 50 is comprised of a central processing unit (CPU) 51, a display 52 such as a cathode ray tube (CRT) or a liquid crystal display (LCD), and an input unit 53 such as a keyboard or mouse. By using an input unit 53, it is possible to give to the simulator 10 the state in which the vehicle is placed (for example, the air temperature, atmospheric pressure, vehicle weight, road gradient, etc.), the degree of depression of the accelerator pedal, the degree of braking, and other operations of the driver. Note that as shown in the figure, the simulator 10 may have a display 61 and input unit 62 connected to it. Further, it is also possible not to connect to a PC 50 and use another display 61 and another input unit 62 instead of the display 52 and input unit 53.

On the other hand, the simulator 10 is comprised of a communication board 11, an input/output board 12, and other boards and a CPU 13. The transfer of signals between the boards and PC 50 and the transfer of signals between boards are handled through the CPU 13. These boards are comprised of CPU's and ROM's, RAM's, and other memories. The functions of these boards are realized by a software program.

The CPU 13 performs for example the processing of the vehicle model. It receives signals from the ECU 1 through the communication board 11 and input/output board 12, simulates the states of the different parts of the vehicle such as the engine speed, vehicle speed, etc., and sends the results of processing to the ECU 1 through the communication board 11 and input/output board 12. Further, it sends them to the PC 50 for display of the states on the display 52 of the PC 50.

The input/output board 12 is a board simulating the signal of an actual vehicle speed sensor from the pattern of the change in the vehicle speed input from the input unit 53 of the PC 50 and outputting a simulated signal. The pattern of change of the vehicle speed from the PC 50 is received by the input/output board 12 through the CPU 13 and output to the ECU 1. Alternatively, the vehicle speed value of the vehicle model processed at the CPU 13 is received by the input/output board 12 and output to the ECU 1. The input/output board 12 receives for example an ignition signal from the ECU 1, converts that signal to a digital amount, and sends it to the CPU 13. Further, it sends it to the PC 50 through the CPU 13 to display the state of the ignition signal at the display 52.

On the other hand, the communication board 11 has the function of preparing an acknowledgement signal when receiving a signal from the ECU 1 or transmitting a signal input from the input unit 53 of the PC 50 to the ECU 1. FIG. 9 is a block diagram of the functions of a communication board 11 of the related art. As shown in the figure, this is comprised of a monitor data converter 21, an acknowledgement signal generator 22 using communication logic, a transmission signal generator 23 using communication logic, and a communication protocol converter 24. The functions of these parts, as explained above, are executed by a software program by the CPU, ROM, RAM, etc.

For example, when an engine speed signal is transmitted from the ECU 1 to the communication board 11, the transmitted engine speed signal is converted to viewable data by the monitor data converter 21, is transmitted to the PC 50, and is displayed at the display 52. Next, the acknowledgement signal generator 22 responds to the transmitted signal and generates an acknowledgement signal based on the communication standard indicating receipt of the signal. This acknowledgement signal is transmitted through the communication protocol converter 24 to the ECU 1. On the other hand, for example, when desiring to transmit a signal indicating that the airbag is normal to the ECU 1, if the normal state of the airbag is input from the input unit 53 of the PC 50, in response to this signal, the transmitted signal generator 23 generates a transmission signal based on the communication standard and transmits this signal to the ECU 1 through the communication protocol converter 24.

As explained above, when a plurality of ECU's share a single communication line to communicate among each other so as to share information for use, when developing any of these ECU's alone in a state with no actual vehicle on hand, the above evaluation device becomes necessary. In actuality, however, the time required for starting up each ECU differs. Therefore, the state of ECU communication right after the power is turned on becomes unstable. Accordingly, in an actual vehicle, for example when the already started up ECU (A) transmits a signal to a not started up ECU (B), the ECU (B) does not return a signal indicating the receipt of the signal from the ECU (A) to the ECU (A).

Therefore, the ECU (A) may erroneously judge that the ECU (B) has broken down or the ECU (A) may continue sending the signal to the ECU (B) and cause an abnormality on the communication line. In the evaluation device of the related art, there was the problem that since the communication boards are always operating normally during the evaluation of the ECU's, it is not possible to simulate the behavior of the ECU's under such unstable states right after the power is turned on.

SUMMARY OF THE INVENTION

An object of the present invention is to provide an evaluation device, for evaluating a control unit to which another control unit is connected through a communication line and communicating with it, which can simulate even an unstable state such as when the other control unit does not start up right after power is turned on and a simulator and evaluation system using the same.

To attain the above object, according to a first aspect of the invention, there is provided an evaluation device for evaluating a control unit able to be connected with another control unit through a communication means, provided with a communication behavior simulating means a for simulating communication behavior of that other control unit and a switching means b for switching the communication behavior simulating means so as not to simulate the communication behavior.

Preferably, the communication behavior simulating means a is provided with an acknowledgement signal generating means c, and the switching means b disables the operation of the acknowledgement signal generating means.

Alternatively, the communication behavior simulating means a is provided with a monitor signal converting means d, an acknowledgement signal generating means e, and a transmission signal generating means f, and the switching means b disables the operation of at least one of the monitor signal converting means d, acknowledgement signal generating means e, and transmission signal generating means f.

According to the above, since the communication behavior simulating means a does not simulate the communication behavior for a certain period, communication can be simulated considering the startup time of the other control unit and evaluation becomes possible in the state actually connected with the other control unit through a communication means.

More preferably, the device enables a time for not simulating the communication behavior to be set. Since a time for not simulating the communication behavior can be set, simulation of communication considering the difference in the startup time with the other control unit becomes possible.

Alternatively, the device is further provided with a signal generating means g for generating a signal for transmission to the control unit to be evaluated in the time when the communication behavior simulating means a is not simulating communication behavior. According to this, simulation of communication considering even the startup time of the other control unit becomes possible and a control unit can be evaluated envisioning the status, such as noise, of various communication lines.

Alternatively, the switching means switches the communication behavior simulating means a so as not to simulate communication behavior when evaluating communication performed at the time of startup of the other control unit.

Alternatively, the device is further provided with an extracting means h for extracting a communication signal indicating that the control unit to be evaluated has started up, and the switching means b switches the communication behavior simulating means a so as not to simulate the communication behavior in the time when the extracting means h does not detect the startup signal.

According to a second aspect of the invention, there is provided an evaluation device for evaluating a control unit able to be connected with another control unit through a communication means, provided with a communication behavior simulating means a for simulating communication behavior of that other control unit and a startup evaluating means i not transmitting a signal to the control unit when evaluating communication performed at the time of startup of the other control unit.

According to the above, simulation of the case where a control unit being evaluated receives various signals before startup and at the time of startup becomes possible, control units with various possible communication line statuses can be evaluated, and so-called harshness tests to control units can be performed.

According to a third aspect of the invention, there is provided a simulator for simulating the behavior of another control unit able to be connected with a specific control unit through a communication means, provided with a communication behavior simulating means a for simulating the communication behavior of that other control unit and a switching means b for switching the communication behavior simulating means a so that it does not simulate communication behavior.

According to the above, since the communication behavior simulating means a does not simulate the communication behavior for a certain period, communication can be simulated considering the startup time of the other control unit and evaluation becomes possible in the state actually connected with the other control unit through a communication means.

According to a fourth aspect of the invention, there is provided a simulator for simulating the behavior of another control unit able to be connected with a specific control unit through a communication means, provided with a communication behavior simulating means a for simulating the communication behavior of that other control unit and a startup evaluating means i not transmitting a signal to the control unit when evaluating communication performed at the time of startup of the other control unit. According to the above, simulation of the case where a control unit being evaluated receives various signals before startup and at the time of startup becomes possible, control units with various possible communication line statuses can be evaluated, and so-called harshness tests to control units can be performed.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

EXAMPLE 1

Figure 1:
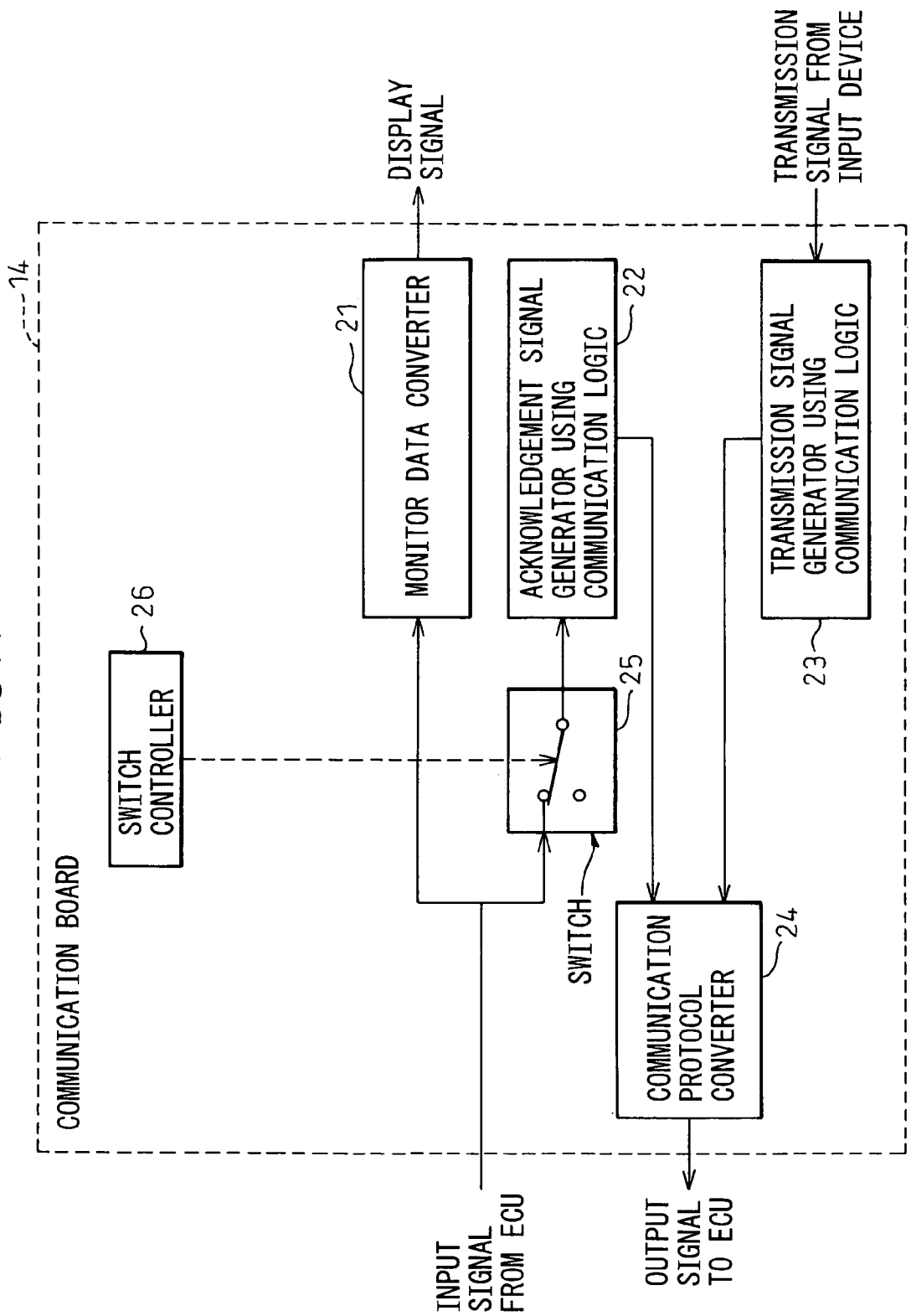
FIG. 1 is a view of a communication board simulating communication behavior in an evaluation device according to an embodiment of the present invention.
Figure 8:
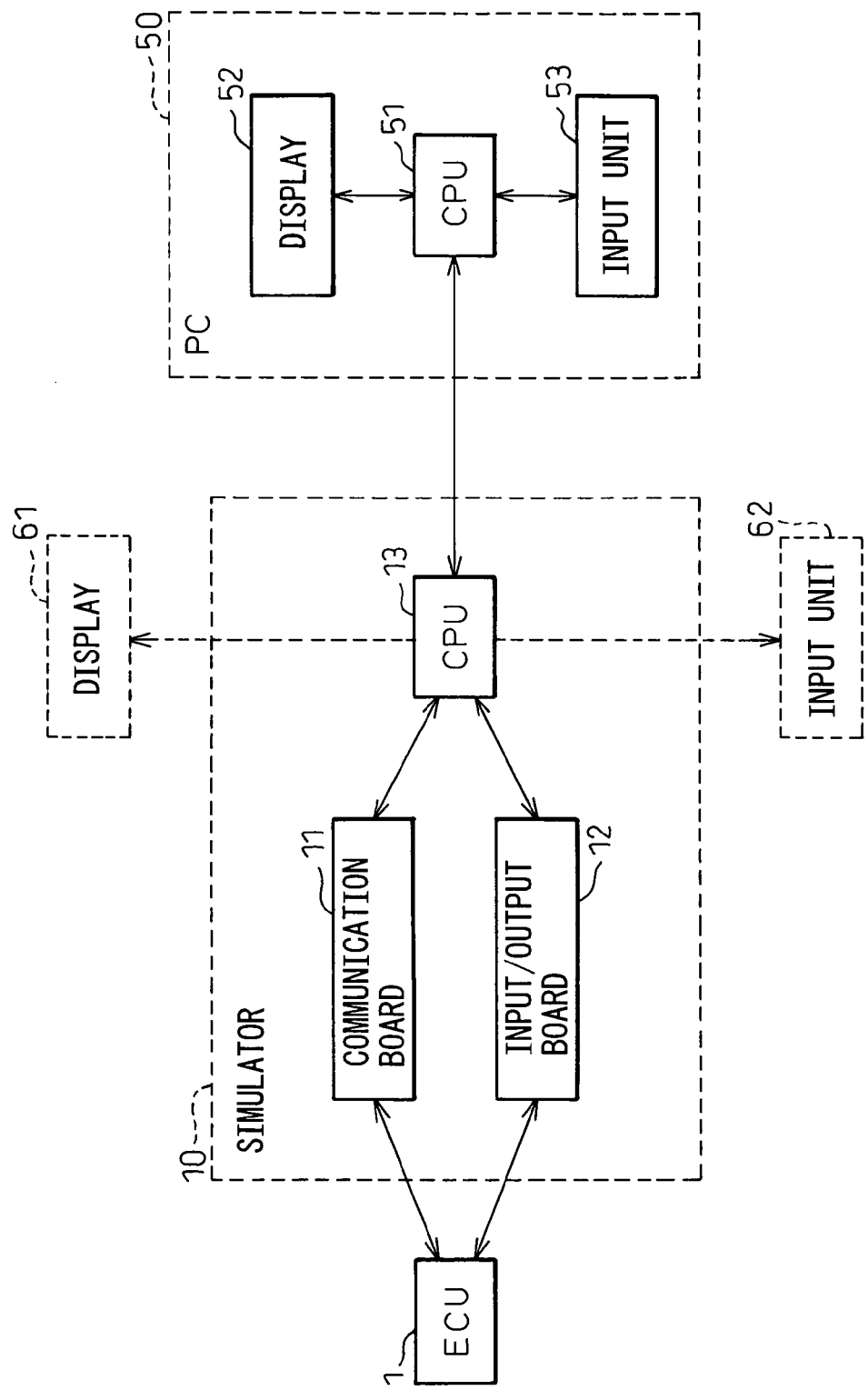
FIG. 8 is a view of an ECU evaluation device of the related art provided with a function of transmitting an acknowledgement signal.
Figure 9:
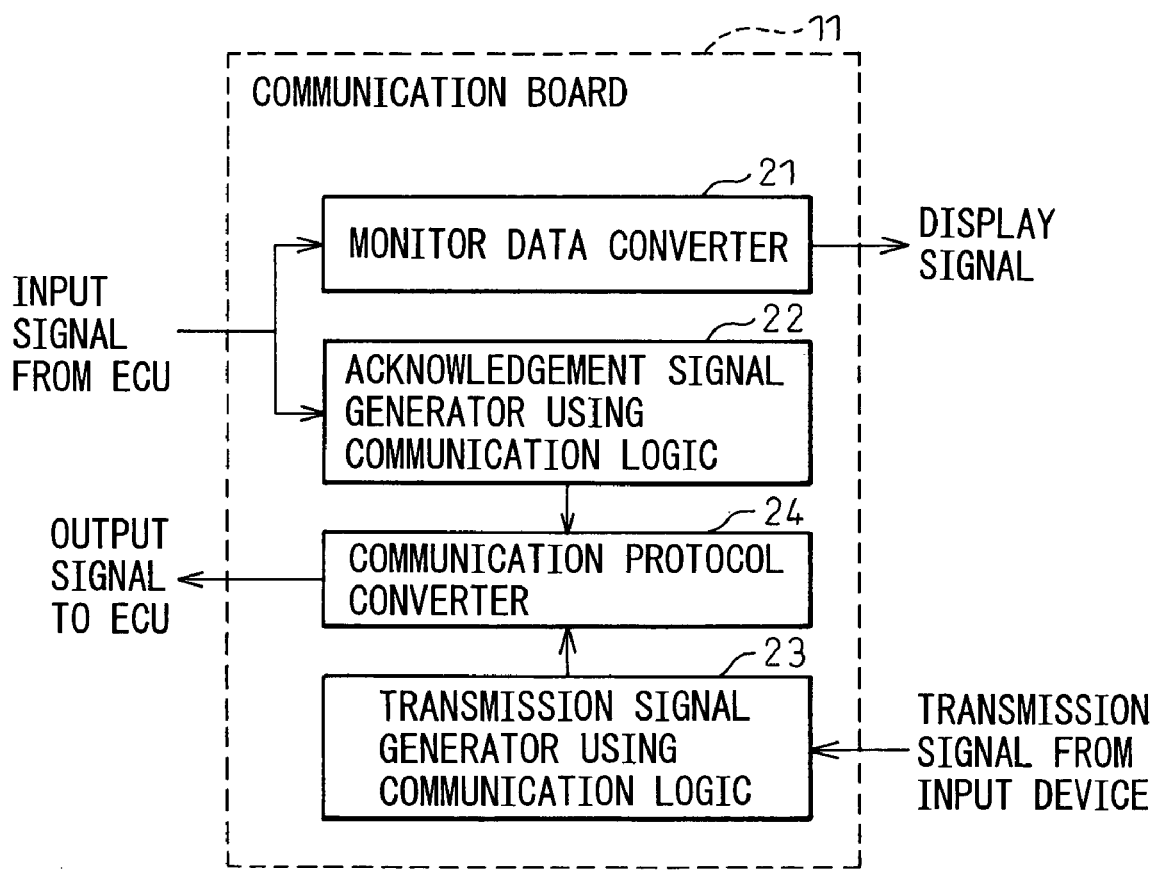
FIG. 9 is a view of a communication board simulating communication behavior in an evaluation device of the related art.

Below, an evaluation device for evaluating a control unit according to an embodiment of the present invention will be explained with reference to the drawings. The overall configuration of the evaluation device of the present invention is the same as the evaluation device shown in FIG. 8. Only the communication board 11 for responding to a communication signal from the ECU 1 differs, so below the embodiment of the evaluation device of the present invention will be explained using the communication board 14 of FIG. 1. The communication board 14, as shown in FIG. 1, is comprised of a monitor data converter 21, an acknowledgement signal generator 22 using communication logic, a transmission signal generator 23 using communication logic, a communication-protocol converter 24, a switch 25, and a switch controller 26. These components, in the same way as explained above, is comprised by a CPU and a ROM, RAM, or other memory. These functions are also executed by a software program.

The monitor data converter 21 converts the transmission signal from the ECU 1 to visible data which it transmits to the PC 50 through the CPU 13. The acknowledgement signal generator 22 responds to the transmission signal from the ECU 1 and generates an acknowledgement signal in accordance with the communication standard indicating the receipt of the signal. The transmission signal generator 23 generates a transmission signal in accordance with the communication standard by the transmission signal to the ECU 1 input from the PC 50. The communication protocol converter 24 converts the protocol of the signal transmitted. Further, the switch 25 switches so as to input or not input the transmission signal from the ECU 1 to the acknowledgement signal generator 22 in accordance with a switch signal from the switch controller 26.

Next, the action of the communication board 14 will be explained. For example, when an engine speed signal is transmitted from the ECU 1 to the communication board 14, in the same way as the above, the transmitted engine speed signal is converted to visible data by the monitor data converter 21, transmitted to the PC 50, and displayed on the display 52. Next, the acknowledgement signal generator 22 responds to this transmission signal and generates an acknowledgement signal indicating the receipt of the signal. This acknowledgement signal is transmitted to the ECU 1 through the communication protocol converter 24. Further, for example, when not transmitting a signal indicating the airbag is normal to the ECU 1, if the operator inputs an airbag normal operation from the input unit 53 of the PC 50, the transmission signal generator 23 generates a transmission signal corresponding to the communication standard in response to the input and transmits this to the ECU 1 through the communication protocol converter 24.

On the other hand, if the operator instructs disabling of the generation of the acknowledgement signal from the input unit 53 of the PC 50, the switch controller 26 switches the switch 25 for a certain time from this command, so the transmission signal from the ECU 1 is no longer input to the acknowledgement signal generator 22 and the acknowledgement signal is no longer sent to the ECU 1. Due to this, for example, when the ECU 1 judges that another ECU has failed, the transmission signal to that other ECU is no longer sent and the transmission signal to that other ECU is no longer displayed at the display 52 of the PC 50, so the operator of the evaluation device can confirm that the ECU 1 has judged a failure. Further, depending on the ECU, the ECU will sometimes continue sending the transmission signal to the other ECU. In this case, the communication signal is displayed on the display 52 of the PC 50 without interruption, so the operator can confirm an abnormality of communication. As explained above, by disabling generation of the acknowledgement signal at the acknowledgement signal generator, it becomes possible to simulate the unstable communication state of the time when right after the other ECU has been powered up and possible to evaluate the ECU in this state.

EXAMPLE 2

Figure 2:
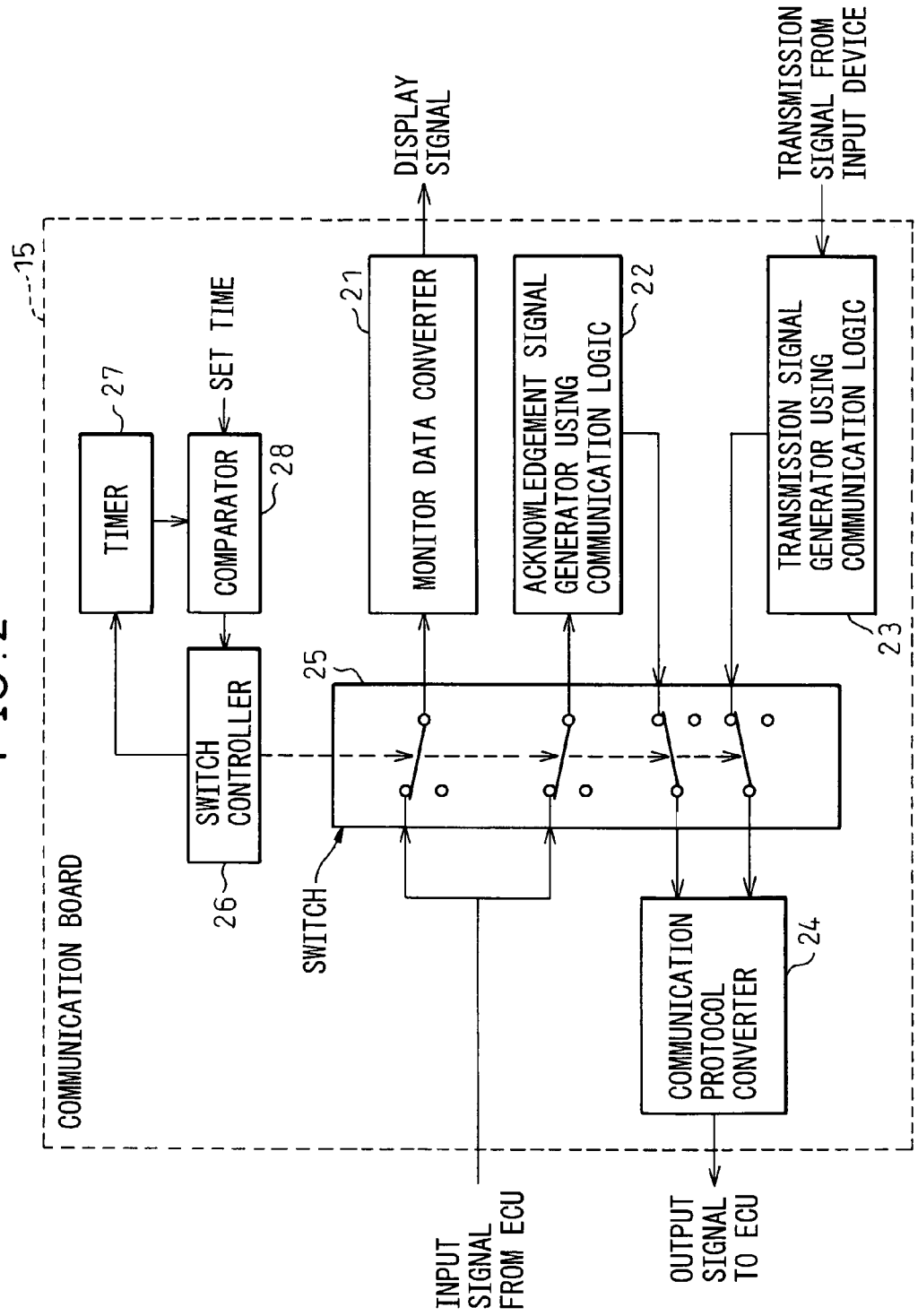
FIG. 2 is a view of a communication board simulating communication behavior in an evaluation device according to another embodiment of the present invention.

In Example 1, only input of the input signal to the acknowledgement signal generator from the ECU was disabled, but the input/output of other signals may also be disabled. An example of an evaluation device able to disable input/output of signals in this way will be explained by the communication board 15 of FIG. 2. This communication board 15, like in FIG. 1, is provided with an acknowledgement signal generator 22 using communication logic, a transmission signal generator 23 using communication logic, a communication protocol converter 24, a switch 25, and a switch controller 26 and is further provided with a timer 27 and a comparator 28. The switch 25 can individually switch the transmission of the input/output signals. Further, the timer 27 measures the time elapsed from the time when the switch controller 26 switches the switch 25, while the comparator 28 compares the set time of switching input from the input unit 53 of the PC 50 and the counted time of the timer 27 and transmits the signal to the switch controller 26 when the set time elapses from the switching of the switch 25.

Figure 3:
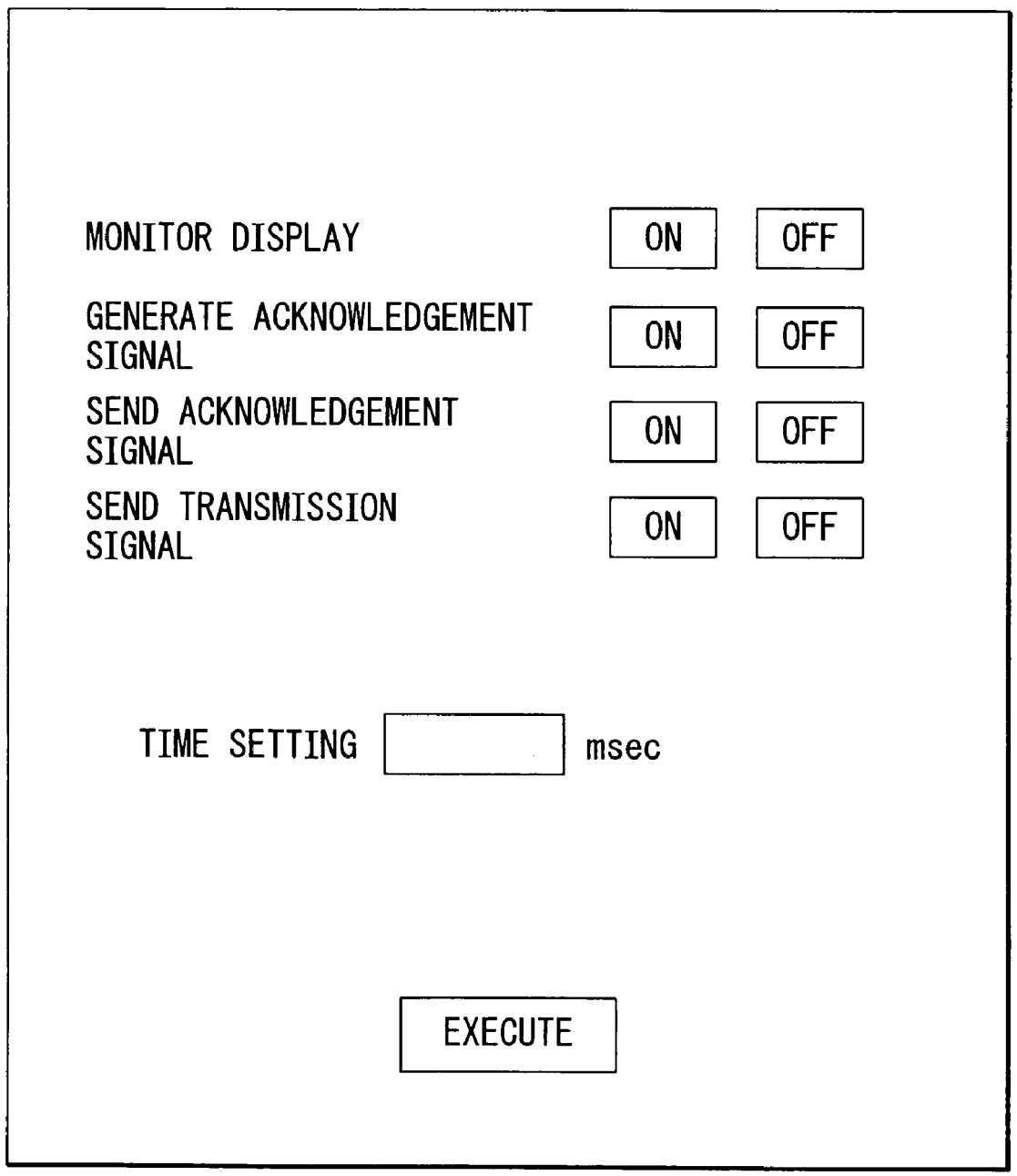
FIG. 3 is a view of an example of screen for disabling input and output of the communication board of FIG. 2.

FIG. 3 shows an example of a screen for disabling input/output displayed on a display 52 of the PC 50. By clicking the "ON" and "OFF" buttons of the fields of "MONITOR DISPLAY", "GENERATE ACKNOWLEDGEMENT SIGNAL", "SEND ACKNOWLEDGEMENT SIGNAL", and "SEND TRANSMISSION SIGNAL" on this screen, it is possible to enable or disable the fields. Further, by inputting any time in the "TIME SETTING" field, it is possible to set the disabled time. Note that when not inputting any time setting, a predetermined fixed time, for example, 300 ms, is set.

After finishing setting the ON/OFF states and inputting the time setting, if the operator of the evaluation device clicks on the "EXECUTE" icon at the bottom of the input screen of FIG. 3, the information is sent from the PC 50 to the communication board 15, the input/output of the field of the switch controller 26 set OFF by the switch 25 is disabled, and the timer 27 counts the elapsed time. When the set time has elapsed, an end signal is sent from the comparator 28 to the switch controller 26, so input/output of the signal is returned to the normal state. Due to this, it is possible to enable/disable the input/output of the signals of the different parts and possible to freely change the time for disabling the operation, so it is possible to simulate various communication behavior and possible to simulate differences in startup times of the ECU's.

EXAMPLE 3

In the above examples, only the generation and transmission of signals were disabled, but it is also possible to transmit noise or another signal to the ECU. An example of an evaluation device for transmitting another signal to the ECU while disabling input/output of signals will be explained by the communication board 16 of FIG. 4. This communication board 16, in the same way, is provided with a monitor data converter 21, an acknowledgement signal generator 22 using communication logic, a transmission signal generator 23 using communication logic, a communication protocol converter 24, a switch 25, and a switch controller 26 and is provided with an irregular signal generator 29. This irregular signal generator 29 generates a preregistered time-series signal or an uncorrelated signal using random numbers or noise. Further, as shown in FIG. 4, it becomes possible to generate an irregular signal by performing preset specific processing on signals from the acknowledgement signal generator 22 and transmission signal generator 23.

Figure 4:
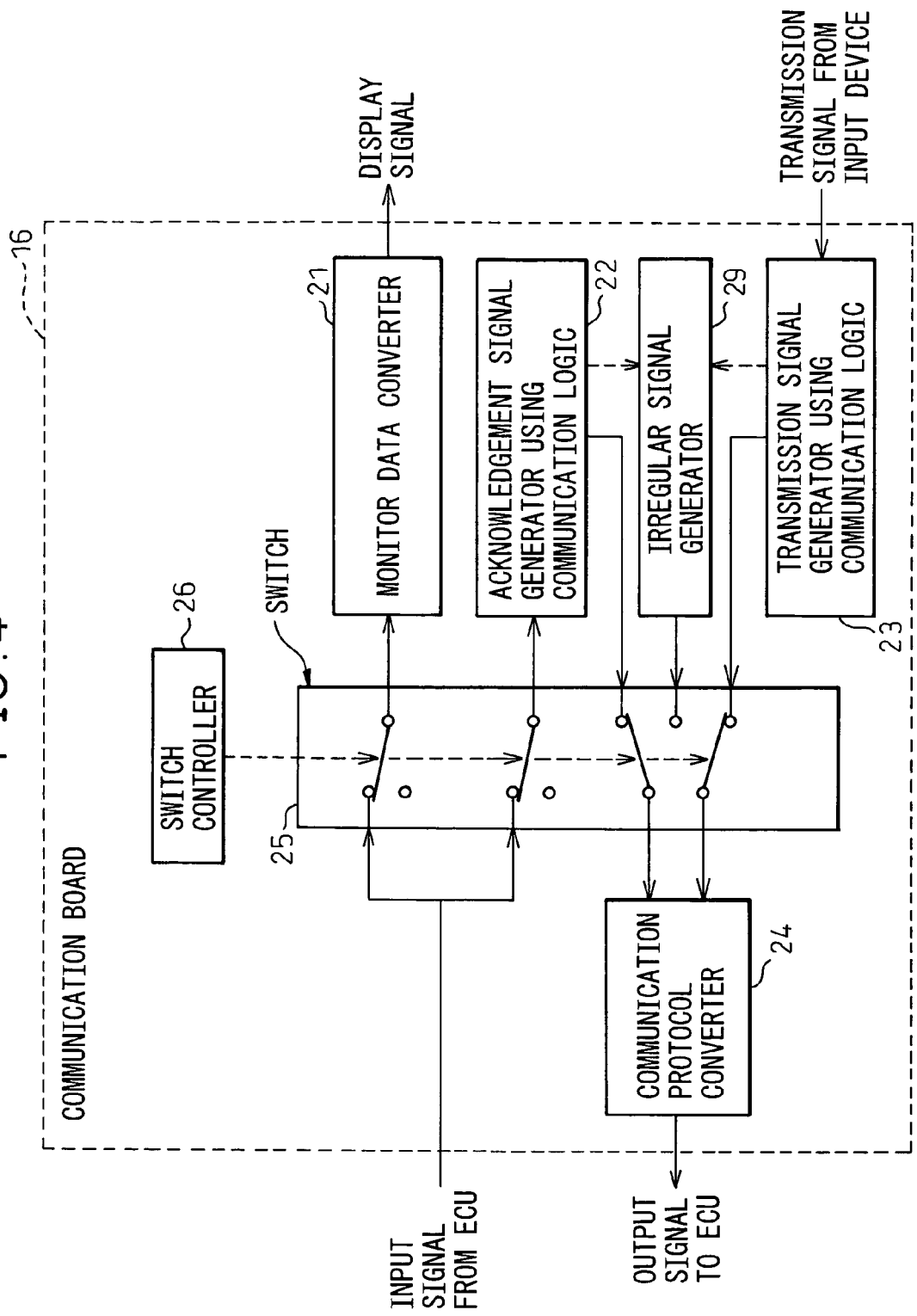
FIG. 4 is a view of a communication board simulating communication behavior in an evaluation device according to still another embodiment of the present invention.

In the communication board 16 shown in FIG. 4, when the output signal of the acknowledgement signal generator 22 or transmission signal generator 23 is switched to the nontransmission state by the switch 25, instead of the output signal of the acknowledgement signal generator 22 or transmission signal generator 23, the output of the irregular signal generator 29, for example, the noise signal, is sent to the ECU 1 through the communication protocol converter 25, so it becomes possible to evaluate the operation of the ECU 1 by the noise or other irregular signal.

EXAMPLE 4

In the above examples, the operator of the evaluation device instructed control of the switch from the input unit 53 of the PC 50 so as to disable transmission of the acknowledgement signal etc, but it is also possible to control the switch by the startup signal of the ECU to be evaluated. An example of an evaluation device for control of the switch by the startup signal of the ECU to be evaluated will be explained using the communication board 17 of FIG. 5. This communication board 17, like in FIG. 4, is provided with a monitor data converter 21, an acknowledge signal generator 22 using communication logic, a transmission signal generator 23 using communication logic, a communication protocol converter 24, a switch 25, a switch controller 26, and an irregular signal generator 29 and is provided with a startup signal extractor 30. The startup signal extractor 30 extracts a signal indicating that the ECU itself has started up from the ECU 1 and transmits the extracted signal to the switch controller 26.

Figure 5:
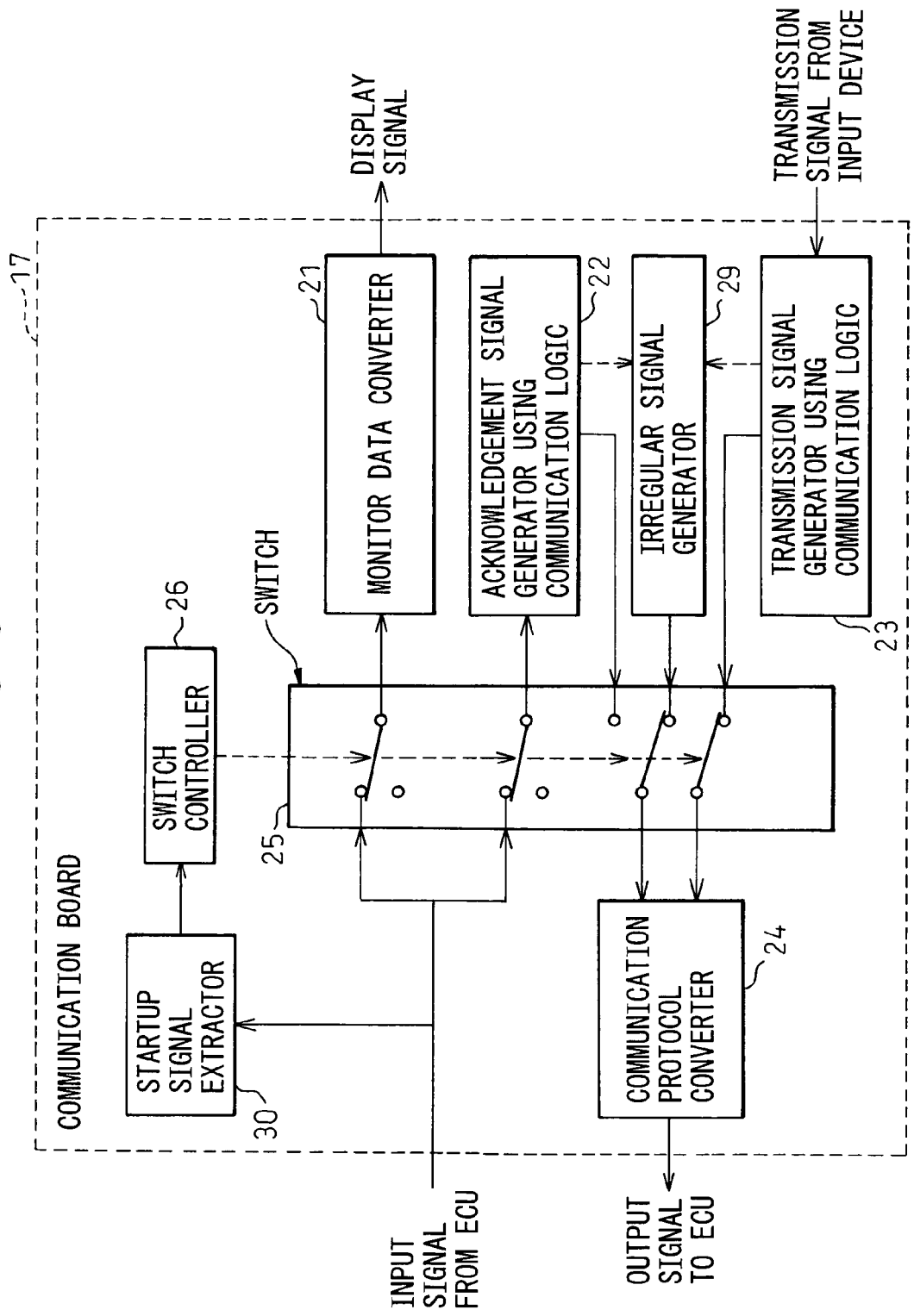
FIG. 5 is a view of a communication board simulating communication behavior in an evaluation device according to still another embodiment of the present invention.
Figure 6:
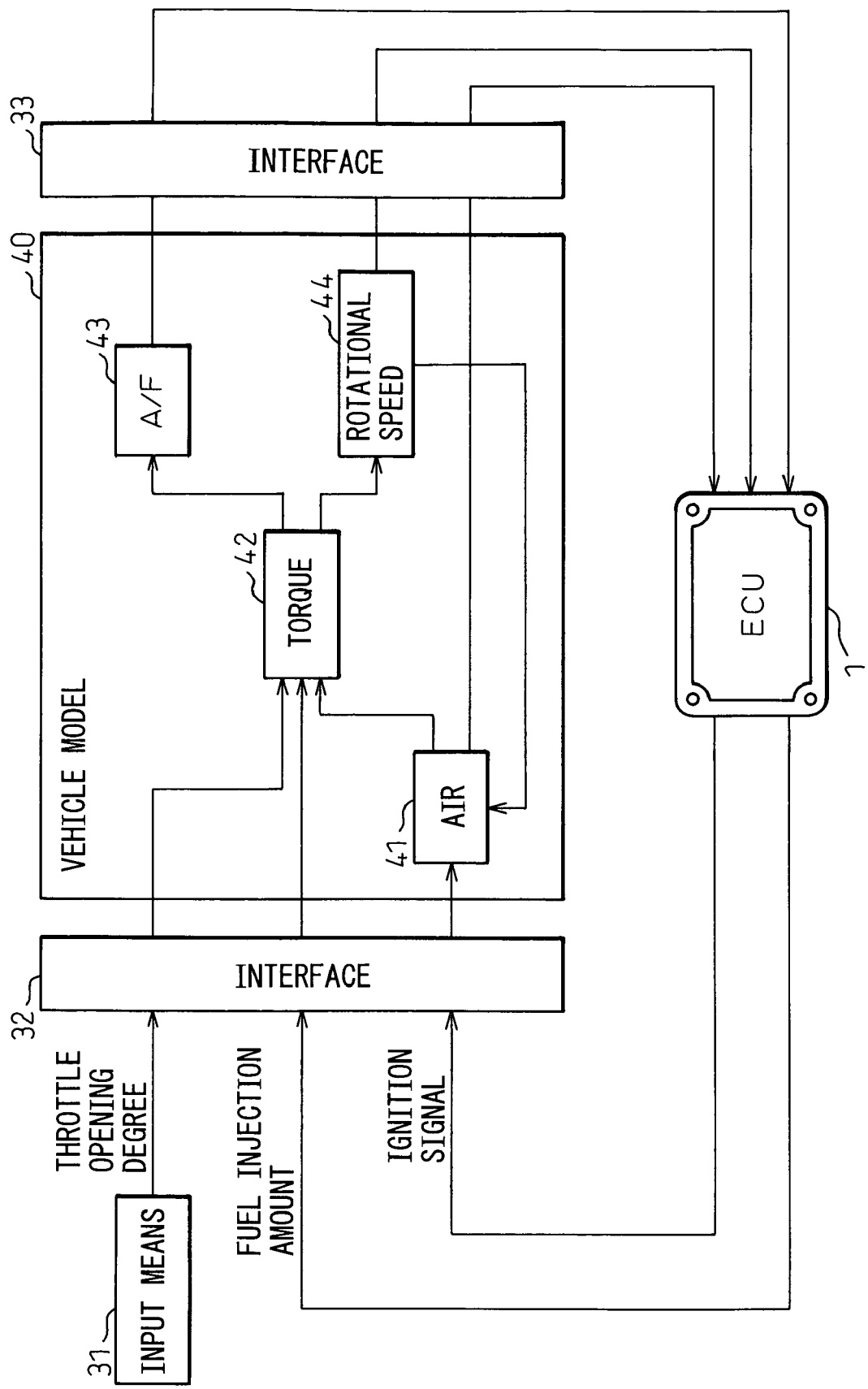
FIG. 6 is a view of an evaluation device of a conventional engine control ECU using a vehicle model.
Figure 7:
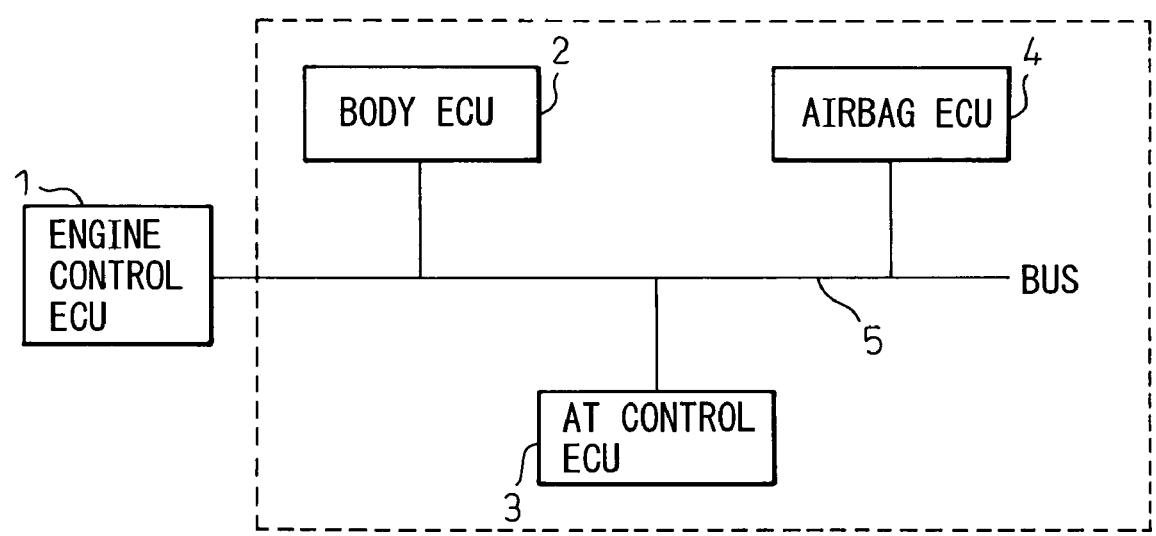
FIG. 7 is a view of an example of a vehicle-mounted LAN to which a plurality of ECU's are connected.

As shown in FIG. 5, in the state before the ECU 1 to be evaluated has started up, the switch 25 switches to a state where the input signal from the ECU 1 is input to the acknowledgement signal generator 22, but the output of the acknowledgement signal generator 22 is not input to the communication protocol converter 24. The output of the irregular signal generator 29 is input to the communication protocol converter 24. Therefore, during startup of the ECU 1 to be evaluated, the irregular signal from the irregular signal generator 29 is sent to the ECU 1. When the ECU 1 to be evaluated starts up and the ECU 1 sends a signal indicating that the ECU 1 has started up to the communication board 17, this signal is detected by the startup signal extractor 30. The startup signal extractor 30 sends the switch signal to the switch controller 26. Due to this, the switch controller 26 controls the switch 25 to switch to a state where instead of the output of the irregular signal generator 29, the output of the acknowledgement signal generator 22 is sent to the ECU 1. As explained above, it is possible to simulate a state where various signals are input during startup of the ECU to be evaluated, so it becomes possible to evaluate operation including so-called harshness tests.

Note that in this example, the switch was used as the switching means to disable the input/output of the signal, but it is also possible to prevent simulation of communication behavior by using the switch controller to prohibit operation of the monitor signal converter, acknowledgement signal generator, transmission signal generator, etc. Further, in Examples 1 to 3, the operator inputs a command from the input unit 53 of the PC 50 so as not to simulate the communication behavior, but it is also possible to automatically prohibit communication behavior after a predetermined time from startup of the ECU to be evaluated or prevent simulation of the communication behavior automatically every predetermined time of the evaluation period.

Further, in the above examples, the evaluation device was configured by a simulator and PC, but by connecting a display and input unit to the simulator as explained above, it is also possible to configure the evaluation device by the simulator alone. Further, in the above examples, the communication board was provided with an acknowledgement signal generator, but the invention is not limited to an acknowledgement signal generator. It is also possible to use a means for communication behavior in accordance with the communication standard.

Further, in the above examples, an example of the evaluation device to which a single engine control ECU was connected for evaluation was explained, but the present invention is not limited to just evaluation of an engine control ECU. It may also be applied to evaluation of another ECU. Further, the present invention may also be applied to an evaluation device to which a plurality of ECU's are connected for evaluation. In addition, the evaluation device of the present invention is not limited to ECU's for vehicles and may be used for evaluation of various control units.

Note that the "evaluation device for evaluating a control unit" of the present invention explained in detail above may also be grasped in concept as a "method of evaluation of a control unit" taking note of the operation of the evaluation device. (Further, it may be grasped as the later explained "evaluation system").

Explaining the method of evaluation here, the method of evaluation may be represented by the following methods M1 to M4:

Method M1

A method of evaluation of a control unit able to be connected to another control unit through a communication function unit, comprising the steps of (i) simulating communication behavior of the other control unit and (ii) switching the communication function unit so that the communication behavior simulating step does not simulate communication behavior.

Method M2

A method of evaluation of a control unit able to be connected to another control unit through a communication function unit, comprising the steps of (i) transmitting a signal to the control unit, (ii) simulating communication behavior of the other control unit, and (iii) stopping transmission of a signal to the control unit when evaluating communication performed at the time of startup of the other control unit.

Method M3

A method of evaluation of a control unit able to be connected to another control unit through a communication function unit, comprising the steps of (i) simulating operation of the other control unit and (ii) switching the communication function unit so that the operation simulating step does not simulate communication behavior.

Method M4

A method of evaluation of a control unit able to be connected to another control unit through a communication function unit, comprising the steps of (i) transmitting a signal to the control unit; (ii) simulating operation of the other control unit; and (iii) stopping transmission of a signal to the control unit when evaluating communication performed at the time of startup of the other control unit.

According to the above, a control unit can be evaluated envisioning various communication statuses, such as noise. Envisioning noise is extremely important in an evaluation system for connecting one engine control ECU to the evaluation device for evaluation.

The evaluation system of the related art generates an ordinary simulated signal from the above unit (vehicle model), makes the evaluation device perform normal processing, and gives the results of processing to the evaluation device for evaluation. Recently, however, users have demanded evaluation under more severe conditions. These severe conditions are "disturbance". A typical example is large noise In general, it is completely impossible to predict which "disturbance" will occur, but with the above evaluation system, it is possible to cause this at any desired timing. Specifically, with the above ECU (control unit) simulator, the causes of this "disturbance" are (1) the sharp drop in the battery voltage at the time of cell motor start, (ii) the generation of a high voltage at the time of engine ignition, and (iii) the discharge of static electricity.

Note that as the evaluation system, the case of coverage of a vehicular ECU was used, but evaluation systems covering car audios, car navigation devices, home audio equipment, mobile communication equipment, arm robot systems in aircraft, ships, and factories also suffer from phenomena linked with such disturbance. Therefore, the evaluation system of the present invention can be broadly applied to cases other than vehicular ECU's as control units.

Here, the problem is the phenomenon that when introducing a disturbance generating means for generating disturbance noise for causing the above disturbance and trying to artificially cause an abnormal state in the control unit (ECU) linked with the evaluation system, the same sort of abnormal state will end up being caused in the evaluation device for monitoring and evaluating the abnormal state. That is, there is the problem of the unit investigating an abnormality of the other unit malfunctioning. With this, naturally, the desired object cannot be achieved.

In view of these problems, the present invention provides an evaluation system which prevents an evaluation device, which monitors and evaluates results of processing from a control unit processing a simulated disturbance signal given to the control unit, from malfunctioning due to the disturbance signal.

Figure 10:
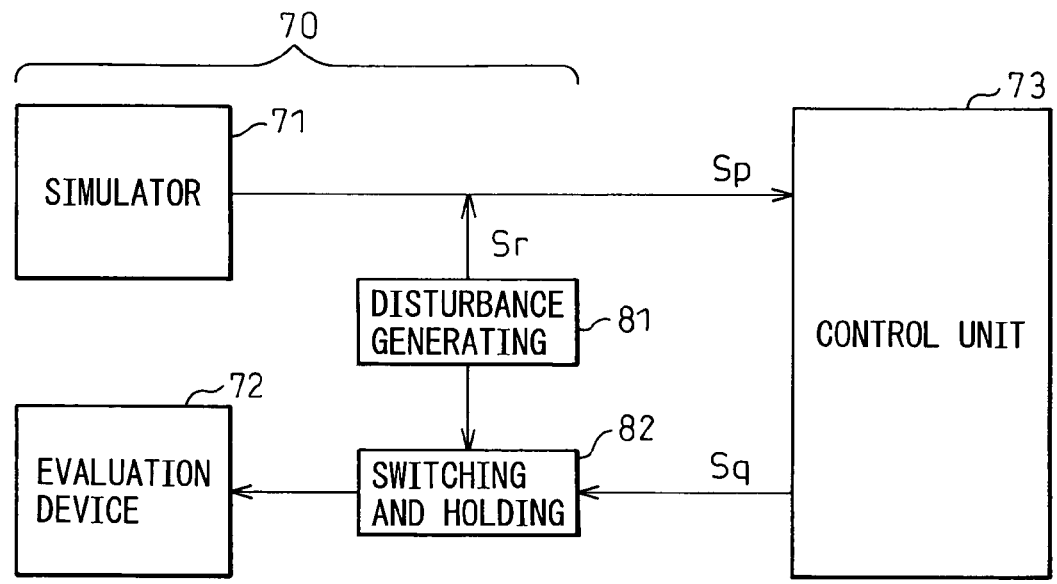
FIG. 10 is a view of the basic configuration of an evaluation system of the present invention.
Figure 11:
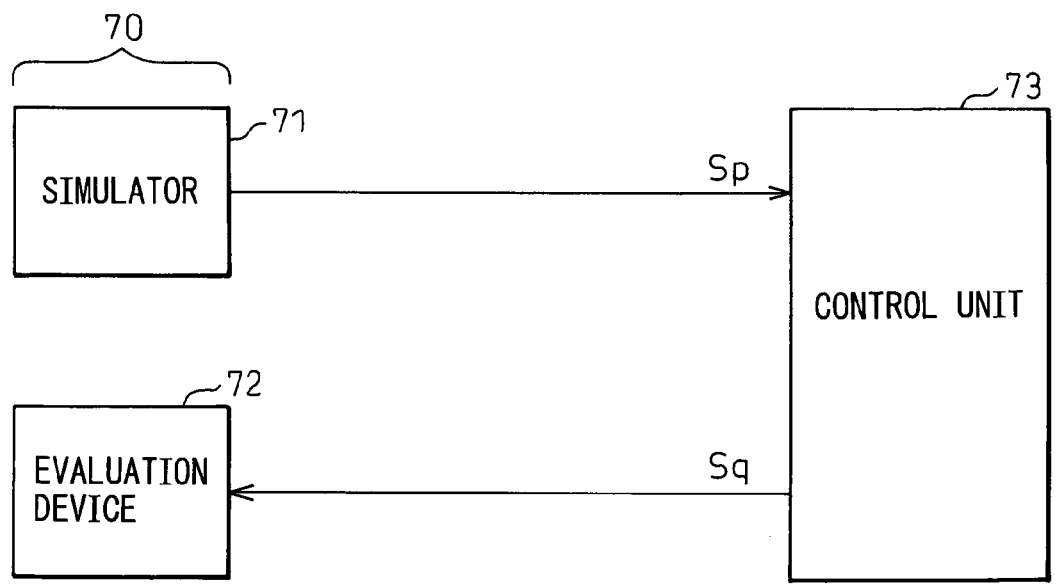
FIG. 11 is a view of the basic configuration of an evaluation system of the related art.

FIG. 10 is a view of the basic configuration of the evaluation system of the present invention. Further, FIG. 11 is a view of the basic configuration of the evaluation system of the related art linked with FIG. 10. A comparison of the two will reveal the features of the system of the present invention. Referring to FIG. 11, reference numeral 70 indicates an evaluation system comprised of a simulator 71 and an evaluation device 72.

More specifically, the evaluation system 70 of the related art is comprised of a control unit 73 to be evaluated, a simulator 71 for simulating a unit to be linked up with (vehicle model), and an evaluation device 72 for receiving the results of processing Sq of the control device 73 processing the simulated signal Sp input from the simulator 71, and evaluating the results of processing Sq.

Next, referring to FIG. 10, the evaluation system 70 according to the present invention introduces a disturbance generating means 81 and switching and holding means 82 in addition to the simulator 71 and evaluation device 72. Here, the disturbance generating means 81 outputs a disturbance signal Sr to be input to the control unit 73 as a simulated signal Sp. Further, the switching and holding means 82 blocks the effects of the disturbance signal Sr on the evaluation device 72, switches to the simulated normal state, and makes the evaluation device 72 hold the simulated normal state. The function of the switching and holding means 82 can be realized by the later explained (i) capacitor 111 and (ii) latch circuit 121 or (iii) software. Note that the system of the present invention is particularly effective for a system where the simulator 71 including the noise generating source and the evaluation device 12 are provided together in the same housing.

Therefore, according to the present invention, it is possible to realize an evaluation system 70 which can handle requests for evaluation of the functions and performance (72) of a control unit (for example, ECU) 73 by the simulator 71 in an abnormal operating environment beyond the normal operating environment without causing the control unit to malfunction or break down.

Figure 12:
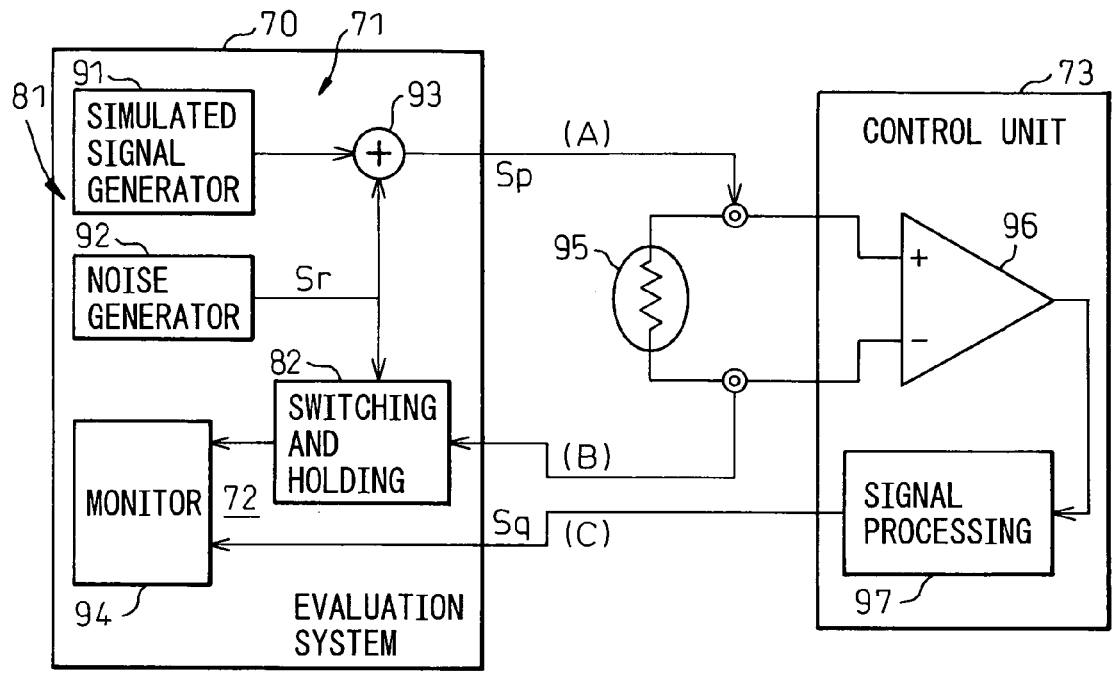
FIG. 12 is a view of an evaluation system according to an embodiment of the present invention.
Figure 13:
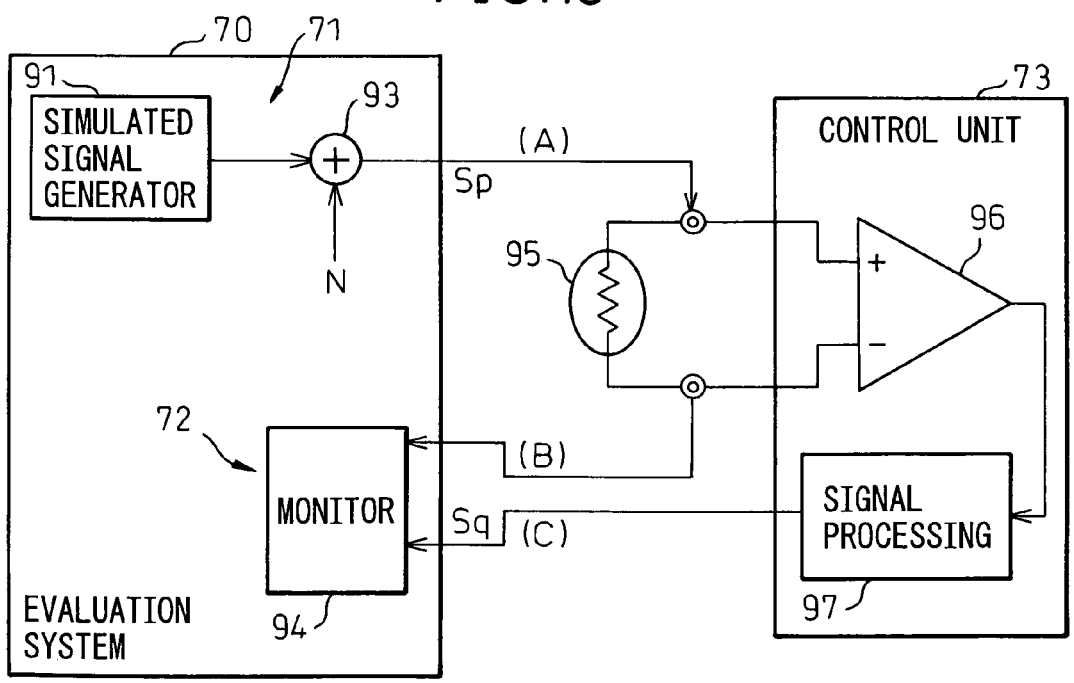
FIG. 13 is a view of an evaluation system according to a related art.

FIG. 12 is a view of a system according to an embodiment of the present invention. FIG. 13 is a view of a system according to the related art corresponding to FIG. 12. First, referring to FIG. 13, the evaluation system 70 is comprised of (i) a simulated signal generator 91 serving as the simulator 71 and an adder 93 for adding noise N and (ii) a monitor 94 serving as the evaluation device 72.

The simulated signal Sp from the simulated signal generator 91 is supplied to the control unit 73. The control unit 73 is comprised of a sensor 95, differential amplifier 96, and signal processor 97. The signal processor 97 processes the simulated signal Sp. The result of processing Sq is returned to the monitor 94 for evaluation. The monitor 94 monitors the signal appearing at one end of the sensor 95. This is for detecting the simulated signal Sp and checking for any abnormality in the sensor supplying this to the differential amplifier 96.

Next, referring to FIG. 12, the switching and holding means 82 introduced in the present invention and the noise generator 92 serving as the disturbance generating means 81 are shown. The disturbance (noise) signal Sr from the noise generator 92 completely differs from the noise N in FIG. 13 (related art). This noise N of the related art is waveform disturbance or a harmonic or other minor noise, but the disturbance (noise) signal Sr covered by the present invention, as explained above, is for example a strong signal causing malfunction (or destruction) of the evaluation device 72 itself such as an ignition signal of the engine.

Figure 14:
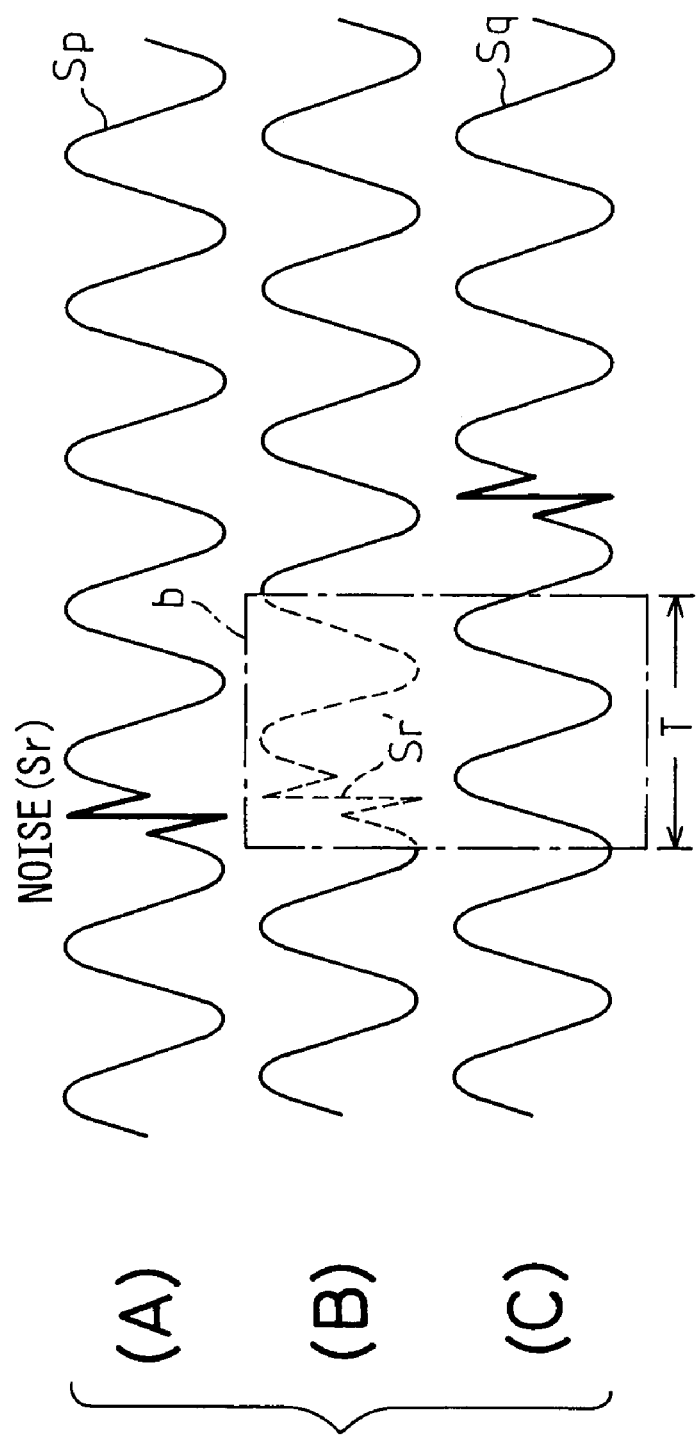
FIG. 14 is a view of an example of signal waveforms appearing at key parts of FIG. 12 and FIG. 13.

Further, this will be explained with reference to FIG. 14. FIG. 14 is a view of an example of the signal waveforms appearing at the point (A), point (B), and point (C) in FIG. 12 and FIG. 13. FIG. 14(A) shows the waveform of the signal appearing at the point (A), that is, the simulated signal Sp. This signal Sp is further given the noise (Sr) from the noise generator 92. The simulated signal Sp of the noise (Sr) is processed by the signal processor 97 in the control unit 73. The result of processing Sq is output with the waveform shown in FIG. 14(C) and input to the monitor 94.

At this time, noise of FIG. 14(A) leaks out to the monitor 94 through the sensor 95. This is shown as the noise Sr' of FIG. 14(B), but this noise (Sr') causes the monitor 94 to malfunction and sometimes can even destroy it. Therefore, when the noise generator 92 sends out noise (Sr), the switching and holding means 82 first blocks the leaked noise (Sr') from entering the monitor 94. This blocked part is shown by the dot-chain line b in FIG. 14(B). The blocking time T of this noise, that is, the holding time T where the evaluation device 72 should be held in the simulated normal state, is the period from right before or right after the output of this noise to when the effect of this noise appears in the results of processing (Sq) of the control unit 73 to be evaluated. The time T can be grasped as the processing delay time at the control unit 73 to be evaluated.

In this blocking time T, the output from the sensor 95 is blocked and not input to the monitor 94. However, if doing this, the monitor 94 is cut off from output from the sensor 95, so may end up erroneously judging that an abnormality has occurred at the sensor 95. Therefore, the switching and holding means 82 is provided with the function of not allowing such erroneous judgment. Several modes of this function may be considered. These will be explained as Examples 1 to 3 later.

Figure 15:
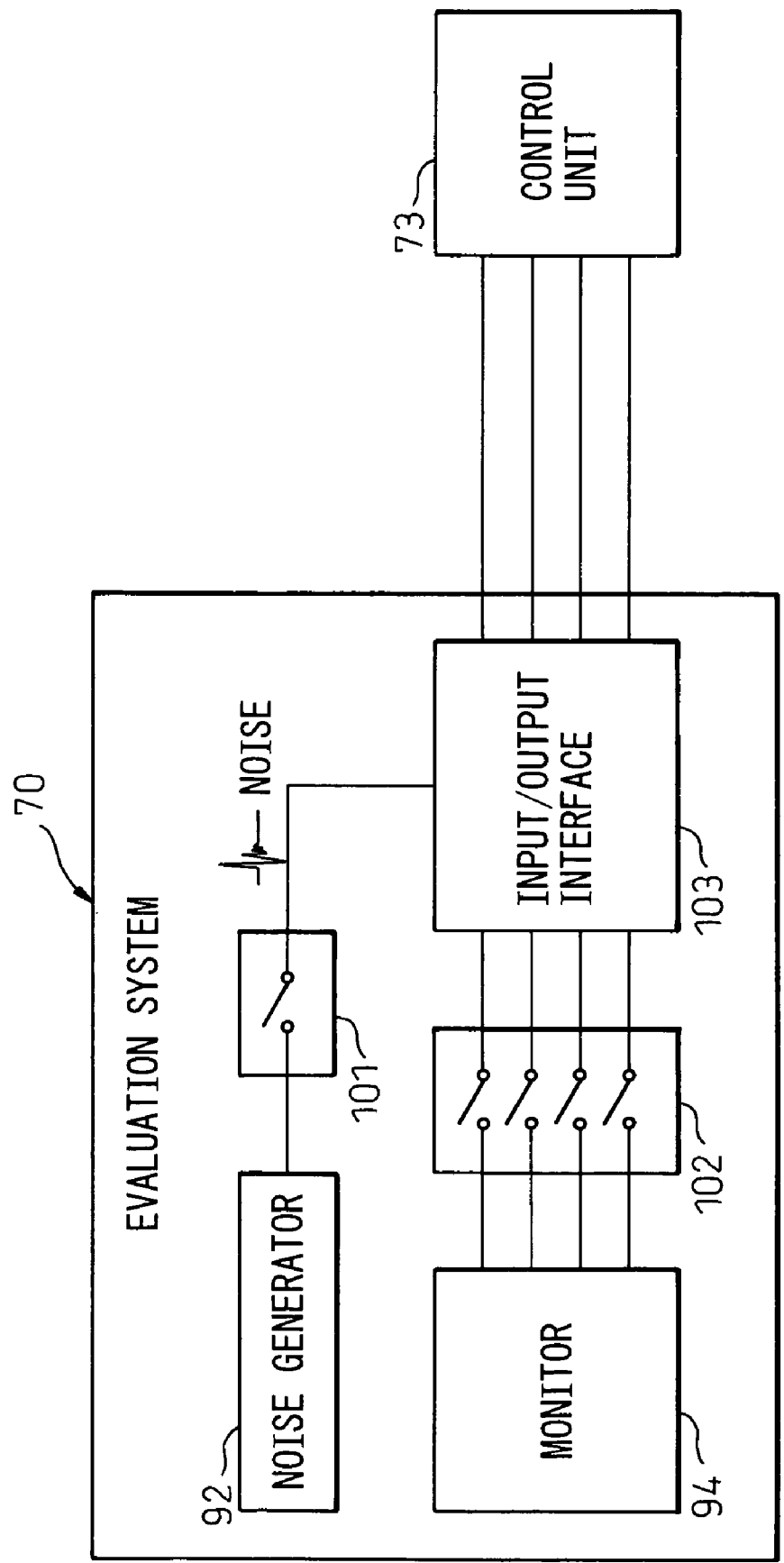
FIG. 15 is a view schematically showing the configuration of FIG. 12.

FIG. 15 is a view schematically showing the configuration of FIG. 12. The descriptions of the simulated signal generator 91 and adder 93 of the simulator 71 are omitted (similarly omitted in the later explained FIG. 16 to FIG. 18). The components newly shown in FIG. 15 are the noise switch 101, the switch 102, and the input/output interface 103. When noise (disturbance Sr) is given and the control unit 73 should be evaluated, the noise switch 10 turns on. The noise reaches the control unit 73 to be evaluated through the input/output interface 103. At this time, the noise sneaking to the monitor 94 through the input/output interface 103 is blocked by the now off switch 102.

Figure 16:
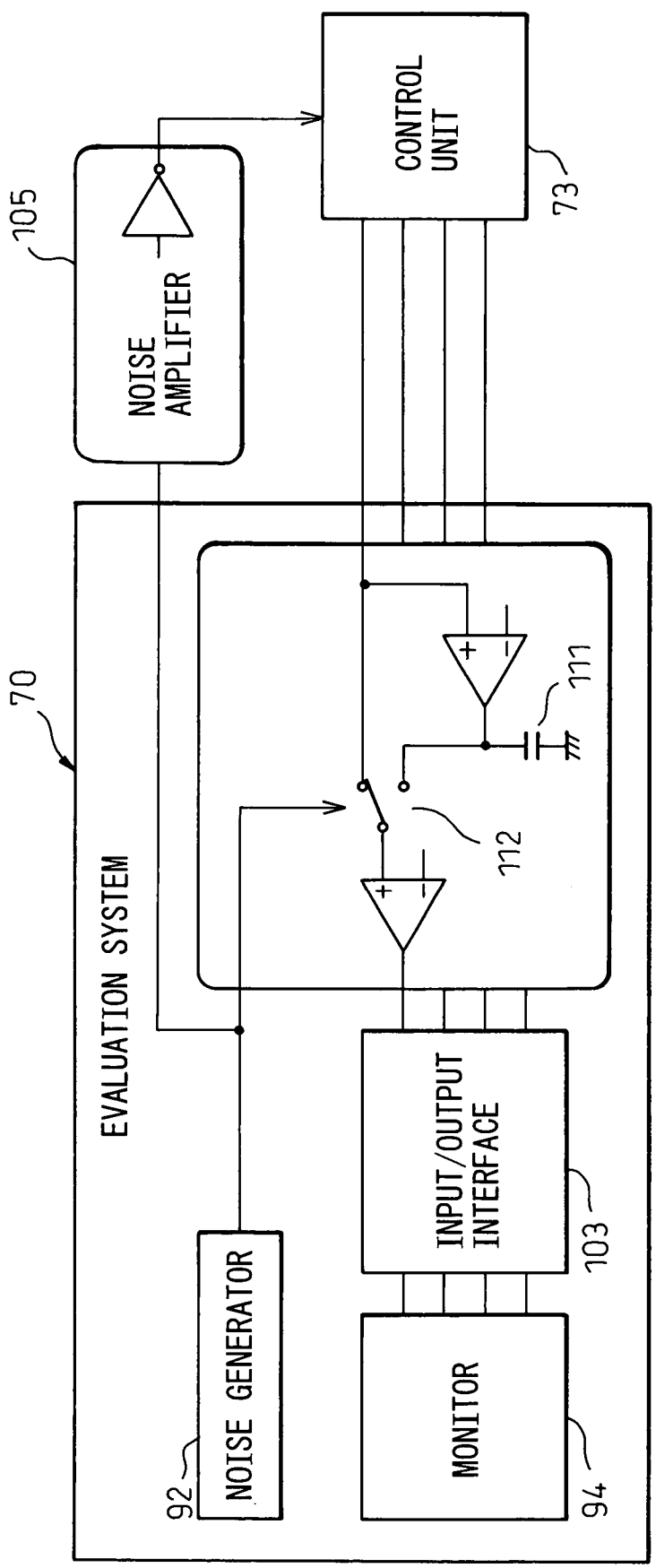
FIG. 16 is a view of Example 1 based on the present invention.
Figure 17:
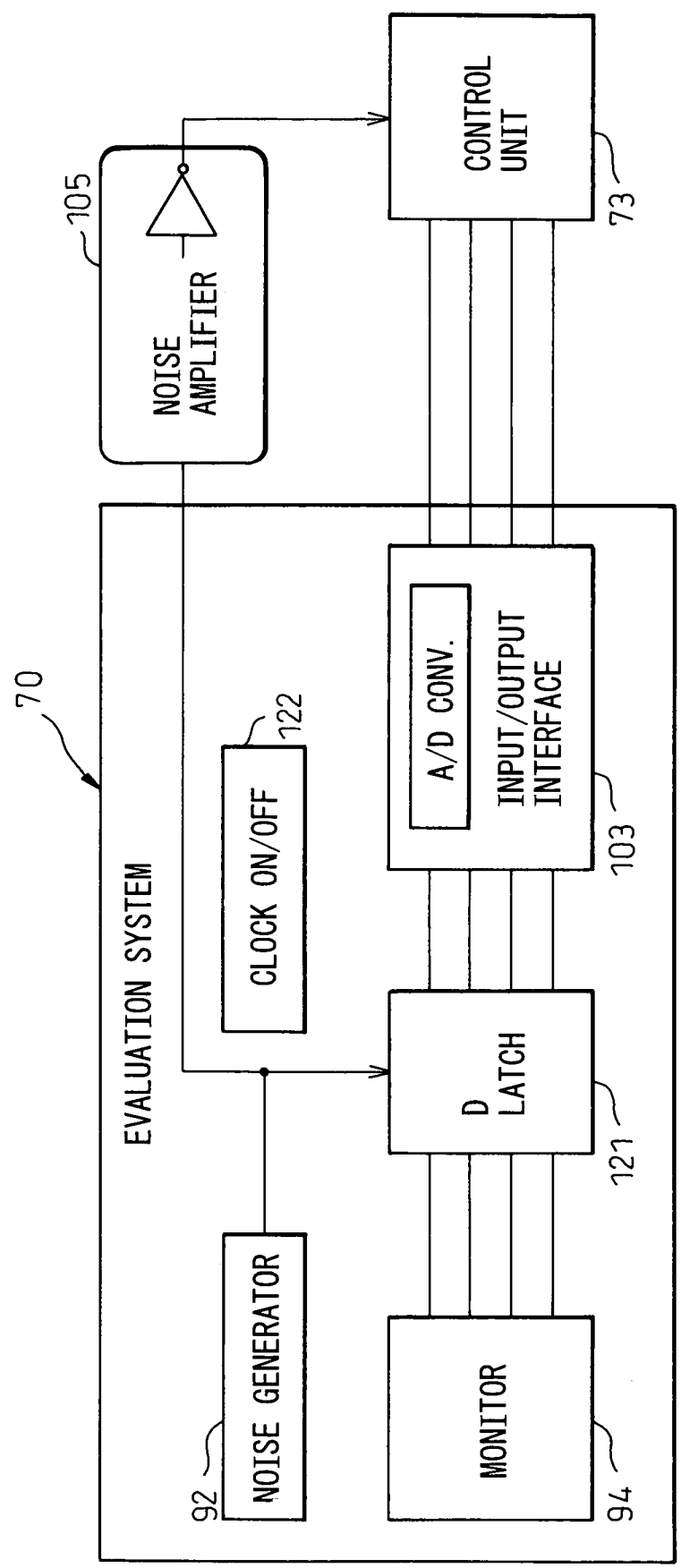
FIG. 17 is a view of Example 2 based on the present invention.
Figure 18:
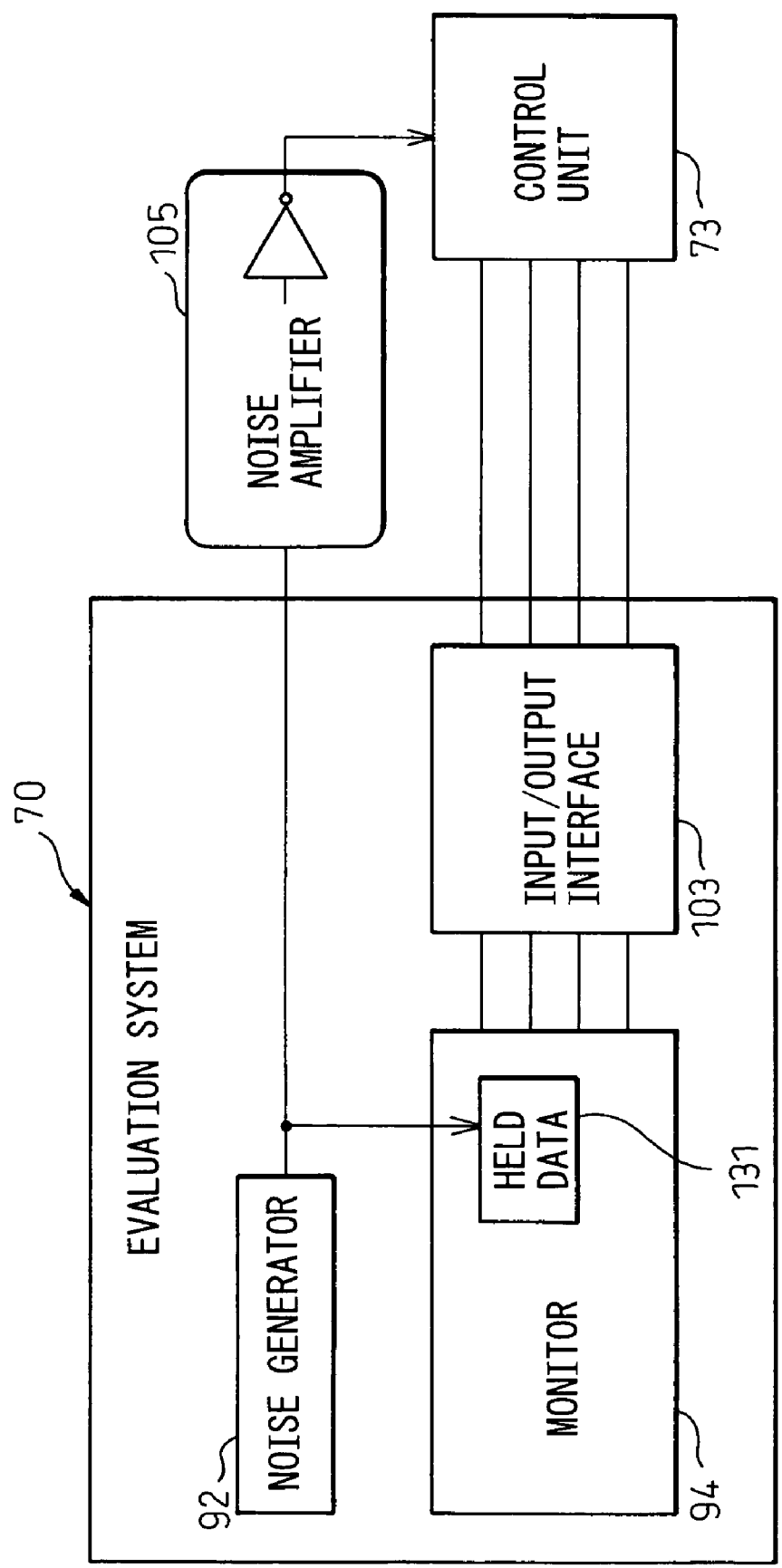
FIG. 18 is a view of Example 3 based on the present invention.

FIG. 16 is a view of Example 1 of the system according to the present invention, FIG. 17 is a view of Example 2 of the system according to the present invention, and FIG. 18 is a view of Example 3 of the system according to the present invention. Examples 1 to 3 realize the switching and holding means 82 in three ways.

First, referring to FIG. 16, the switching and holding means (82) according to Example 1 is a capacitor for holding the voltage on the signal line from the control unit 73 to the monitor (evaluation device) 94 or the predetermined default voltage. This is shown by reference numeral 111. In this case, the switching and holding means (82) is provided with a switch 112 for switching from the signal line side, from the control unit 73 to the monitor 94, to the capacitor side when outputting the disturbance signal.

Note that in this drawing, the capacitor 111 and switch 112 are shown as a set. Such a set is provided for each necessary signal line. The noise (Sr) from the noise generator 92 is supplied to the control unit 73 through the noise amplifier 105. At this time, the switch 112 switches to the capacitor 111. Due to this, the charging voltage of the capacitor 111 right before switching is instead given to the monitor 94. The monitor 94 continues to monitor as if there had been no abnormality at all from the start. When the masking time T passes, the original wired state is returned to. Note that as the signal to be switched and held, instead of the voltage of the capacitor 111, a predetermined default voltage is also possible. However, giving the immediately previous capacitor voltage to the monitor 94 enables a more natural blocking time (T) to be realized. The advantage of Example 1 is that when using an existing evaluation system 70, when remodeling the evaluation system 70 to the evaluation system according to the present invention, this remodeling can be realized simply and inexpensively by just attaching the capacitor 111 and switch 112.

Next, referring to FIG. 17, the switching and holding means according to Example 2 (82) is a latch circuit able to hold data on a signal line from the control unit 73 to be evaluated to the monitor (evaluation device) 93 or predetermined default data. This is expressed by reference numeral 121. In more detail, the switching and holding means (82) is a latch circuit (D latch) 121 provided with a clock controller 122 for making the latch circuit perform a holding operation. The noise (Sr) from the noise generator 92 is supplied to the control unit 73 to be evaluated through the noise amplifier 105. At that time, the clock generator 122 is made to stop the supply of the clock to the latch circuit 121. This being the case, the data which had been given through the input/output interface 103 from the control unit 73 to the monitor 94 up to right before while being converted from an analog to digital format is held as it is at the latch circuit 121 and given to the monitor 94. Therefore, the monitor 94 is placed in a state with no abnormalities. Further, if the already explained blocking time T passes, the clock generator 122 starts to supply the clock to the latch circuit 121 once again. The data showing the result of processing (Sq) is given successively to the monitor 94.

Note that the data to be held may also be predetermined default data instead of the data of right before the latch circuit 121. However, giving the data right before to the monitor 94 enables a more natural blocking time (T) to be realized.

The advantage of Example 2 is that both the results of analog processing and the results of digital processing from the control unit 73 can be handled.

Figure 19:
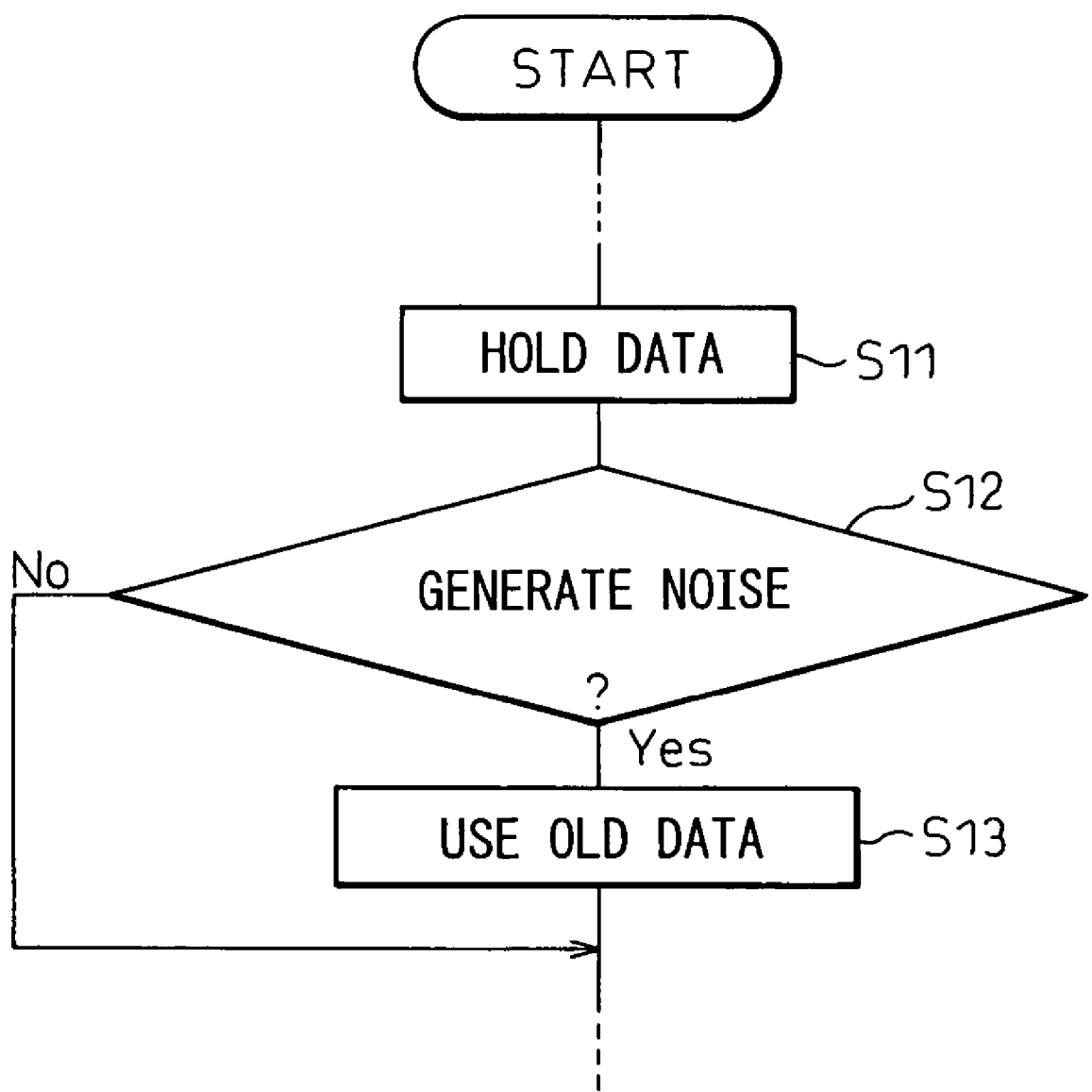
FIG. 19 is a view of an example of a flow chart in Example 3.

Finally, referring to FIG. 18 and FIG. 19, the function of the switching and holding means (82) according to Example 3 is realized by executing a step of holding data from the control unit 73 of right before output or predetermined default data when outputting noise (disturbance signal) when including a step of holding data in software (operation program) of the evaluation device 73.

FIG. 19 is a view of an example of a flow chart including the above step. Referring to FIG. 19 and FIG. 18, the flow of FIG. 19 starts by startup of the evaluation system 70.

S11: The data of the results of processing supplied from the control unit 73 through the input/output interface 103 is stored for example in the data holder 131 in the monitor 94. Along with this, evaluation is performed based on the data stored in the monitor 94.

S12: It is judged if noise is to be generated from the noise generator 92.

S13: If noise is to be generated (YES), the immediately previous data (old data) held in the data holder 131 is used for evaluation in the same way as the latter half of S11.

Note that as the immediately previous data at S13, predetermined default data may be employed. The advantage of Example 3 is that even if a pulse-like signal is output from the control unit 73, it can be handled.

Figure 20:
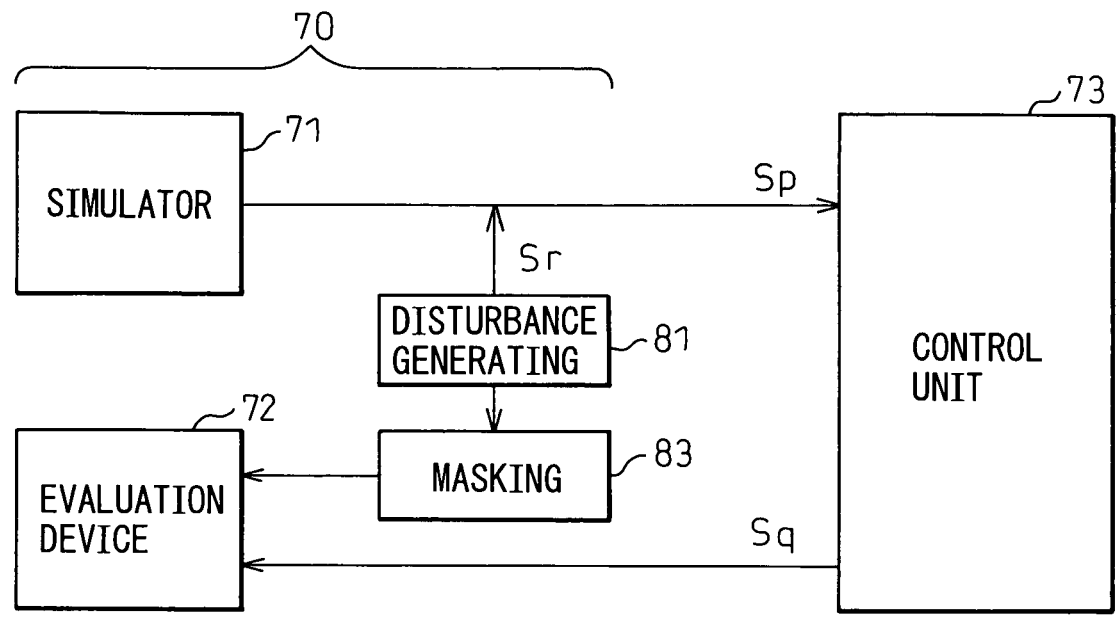
FIG. 20 is a view of a second embodiment according to the present invention.
Figure 21:
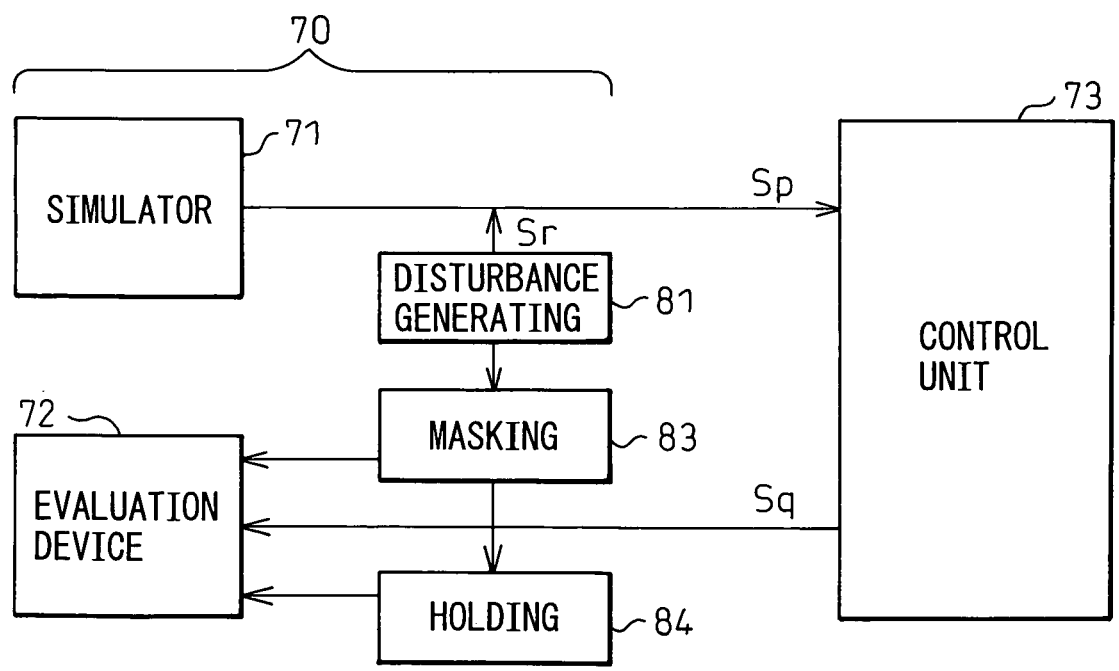
FIG. 21 is a view of an example according to a second embodiment shown in FIG. 20.

Above, a preferred embodiment of the system of the present invention will be explained, but a second embodiment may also be considered. FIG. 20 is a view of a second embodiment of a system according to the present invention. FIG. 21 is a view of an embodiment based on the second embodiment shown in FIG. 20.

For example, referring to FIG. 16 (Example 1), the technical idea of the present invention can be realized by just the capacitor 111 to switch 112. The switch 112 in this case is shown as a masking means 83. The "masking means" means a means for masking the entry of noise to the evaluation device 72. This is shown in FIG. 20.

Further, it is more preferable to add a holding function similar to that of the switching and holding means 82 while masking the entry of noise. This is the holding means 84 and is shown in FIG. 21. That is, in the evaluation system according to the second embodiment of the present invention, the disturbance generating means 81 and the masking means 82 are introduced in addition to the simulator 71 and evaluation device 72. Here, the disturbance generating means 81 outputs as the simulated signal Sp the disturbance signal Sr to be input to the control unit 73. The masking means 82 blocks the effects of the disturbance signal Sr to the evaluation device 72 at the time of output of the disturbance signal Sr. Further, the holding means 83 holds the simulated normal state at the evaluation device 72 at the time of output of the disturbance signal Sr.

While the invention has been described with reference to specific embodiments chosen for purpose of illustration, it should be apparent that numerous modifications could be made thereto by those skilled in the art without departing from the basic concept and scope of the invention.

What is claimed is:

1. An evaluation device for evaluating a control unit able to be connected with another control unit through a communication function unit, provided with
 a communication behavior simulating function unit for simulating communication behavior of that other control unit and
 a switching function unit for switching said communication behavior simulating function unit so as not to simulate the communication behavior,
 wherein the evaluation of said control unit is achieved when the communication behavior is not simulated by said communication behavior simulating function unit.

2. An evaluation device for evaluating a control unit as set forth in claim 1, wherein
 said communication behavior simulating function unit is provided with an acknowledgement signal generating function unit, and
 said switching function unit disables the operation of said acknowledgement signal generating function unit.

3. An evaluation device for evaluating a control unit as set forth in claim 1, wherein
 said communication behavior simulating function unit is provided with a monitor signal converting function unit, an acknowledgement signal generating function unit, and a transmission signal generating function unit, and
 said switching function unit disables the operation of at least one of said monitor signal converting function unit, acknowledgement signal generating function unit, and transmission signal generating function unit.

4. An evaluation device for evaluating a control unit as set forth in claim 1, enabling a time for not simulating the communication behavior to be set.

5. An evaluation device for evaluating a control unit as set forth in claim 1, further provided with a signal generating function unit for generating a signal for transmission to the control unit to be evaluated in the time when said communication behavior simulating function unit is not simulating communication behavior.

6. An evaluation device for evaluating a control unit as set forth in claim 1, wherein the switching function unit switches said communication behavior simulating function unit so as not to simulate communication behavior when evaluating communication performed at the time of startup of the other control unit.

7. An evaluation device for evaluating a control unit as set forth in claim 6, wherein
 the device is further provided with an extracting function unit for extracting a communication signal indicating that the control unit to be evaluated has started up, and
 said switching function unit switching said communication behavior simulating function unit so as not to simulate the communication behavior in the time when said extracting function unit does not detect the startup signal.

8. An evaluation device for evaluating a control unit able to be connected with another control unit through a communication function unit, provided with:
 a communication behavior simulating function unit for simulating communication behavior of that other control unit and
 a startup evaluating function unit not transmitting a signal to the control unit when evaluating communication performed at the time of startup of the other control unit,
 wherein the evaluation of said control unit is achieved when the communication behavior is not simulated.

9. A simulator for simulating the behavior of another control unit able to be connected with a specific control unit through a communication function unit, provided with
 a communication behavior simulating function unit for simulating the communication behavior of that other control unit and
 a switching function unit for switching said communication behavior simulating function unit so that it does not simulate communication behavior,
 wherein the evaluation of said control unit is achieved when the communication behavior is not simulated by said communication behavior simulating function unit.

10. A simulator for simulating the behavior of another control unit able to be connected with a specific control unit through a communication function unit, provided with:
 a communication behavior simulating function unit for simulating the communication behavior of that other control unit and
 a startup evaluating function unit not transmitting a signal to the control unit when evaluating communication performed at the time of startup of the other control unit,
 wherein the evaluation of said control unit is achieved when the communication behavior is not simulated.

11. A method of evaluation of a control unit able to be connected to another control unit through a communication function unit, comprising the steps of:
 simulating communication behavior of said other control unit and
 switching said communication function unit so that said communication behavior simulating step does not simulate communication behavior,
 wherein the evaluation of said control unit is achieved when the communication behavior is not simulated in said switching step.

12. A method of evaluation of a control unit able to be connected to another control unit through a communication function unit, comprising the steps of:
 transmitting a signal to said control unit,
 simulating communication behavior of said other control unit, and
 stopping transmission of a signal to said control unit when evaluating communication performed at the time of startup of the other control unit,
 wherein the evaluation of said control unit is achieved when the communication behavior is not simulated.

13. A method of evaluation of a control unit able to be connected to another control unit through a communication function unit, comprising the steps of:
 simulating operation of said other control unit and
 switching said communication function unit so that said operation simulating step does not simulate communication behavior,
 wherein the evaluation of said control unit is achieved when the communication behavior is not simulated by said switching step.

14. A method of evaluation of a control unit able to be connected to another control unit through a communication function unit, comprising the steps of:
 transmitting a signal to said control unit;
 simulating operation of said other control unit; and
 stopping transmission of a signal to said control unit when evaluating communication performed at the time of startup of the other control units,
 wherein the evaluation of said control unit is achieved when the communication behavior is not simulated.

* * * * *